(12) United States Patent
Bishop et al.

(10) Patent No.: US 10,475,179 B1
(45) Date of Patent: Nov. 12, 2019

(54) COMPENSATING FOR REFERENCE MISALIGNMENT DURING INSPECTION OF PARTS

(71) Applicant: Velocity Image Processing LLC, Needham, MA (US)

(72) Inventors: Robert P. Bishop, Newton, MA (US); Timothy Pinkney, Somerville, MA (US)

(73) Assignee: Velocity Image Processing LLC, Needham, MA (US)

( * ) Notice: Subject to any disclaimer, the term of this patent is extended or adjusted under 35 U.S.C. 154(b) by 0 days.

(21) Appl. No.: 16/357,590

(22) Filed: Mar. 19, 2019

Related U.S. Application Data

(60) Provisional application No. 62/744,746, filed on Oct. 12, 2018.

(51) Int. Cl.
*G06T 7/00* (2017.01)
*G01R 31/308* (2006.01)

(52) U.S. Cl.
CPC ............ *G06T 7/001* (2013.01); *G01R 31/308* (2013.01); *G06T 2207/30148* (2013.01)

(58) Field of Classification Search
CPC .......... G06T 7/001; G06T 2207/30148; G01R 31/308
See application file for complete search history.

(56) References Cited

U.S. PATENT DOCUMENTS

| | | | |
|---|---|---|---|
| 6,427,024 B1 | 7/2002 | Bishop | |
| 6,829,382 B2* | 12/2004 | Lee | G06T 7/0002 382/151 |
| 9,401,014 B2* | 7/2016 | Zafar | G03F 1/84 |
| 2002/0168099 A1 | 11/2002 | Noy | |
| 2010/0215247 A1* | 8/2010 | Kitamura | G06T 7/001 382/149 |
| 2015/0228063 A1* | 8/2015 | Minakawa | H01J 37/244 382/151 |
| 2019/0147579 A1* | 5/2019 | Fang | G06T 7/0004 |

\* cited by examiner

*Primary Examiner* — Yon J Couso
(74) *Attorney, Agent, or Firm* — David J. Thibodeau, Jr.; VLP Law Group LLP

(57) ABSTRACT

Methods and apparatus for inspection of electronic parts such as semiconductor wafers, high-density circuit boards, multi-layer substrates, chrome on glass masks, and other fine line products which compensates for reference misalignment. Conductor linewidth and space measurements are performed along the entire length of every conductor to sub-camera pixel, sub-micron accuracy in real time as the part is scanned. Billions of metrology measurements are also performed in real time to sub-micron accuracy. A self-learning automated method to extract measurement values from Computer Aided Design (CAD) files is described. This method automatically determines locations to perform these billons of operations within defined allowed manufacturing tolerances.

26 Claims, 30 Drawing Sheets

Wafer or Circuit Board Substrate with
Numerous Die

Reference Image of
Conductor (Black)

Scanned Camera Image
of Conductor (Gray)

Perfect Superposition of Scanned Camera Image Over Reference Image Showing Defect

Limitations of Pattern Matching Used By Prior Art Inspection Systems

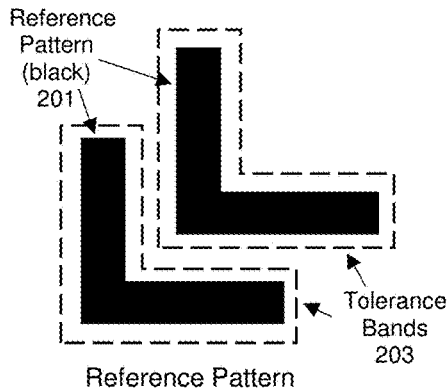

Reference Pattern
Dashed Lines Indicate Allowed
Spatial Tolerance Band to
Accommodate Manufacturing
Limitations and Stage Inaccuracies
Figure 2A

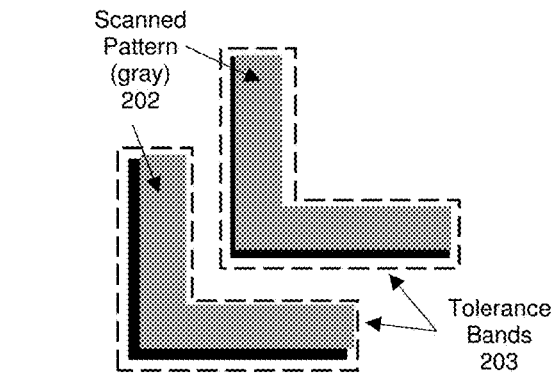

Scanned Pattern Classified as Good Because
it lies within Tolerance Band when
Superimposed over Reference Pattern
Figure 2B

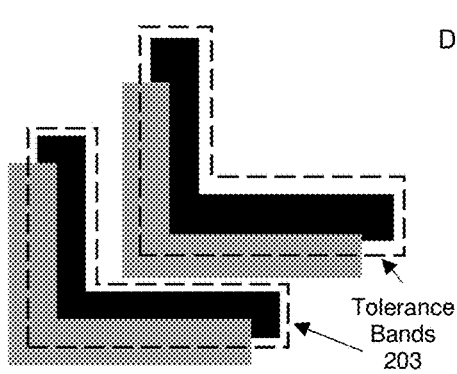

Scanned Pattern Classified as Defective
Because it lies Outside Tolerance Band
when Superimposed over Reference
Pattern
Figure 2C

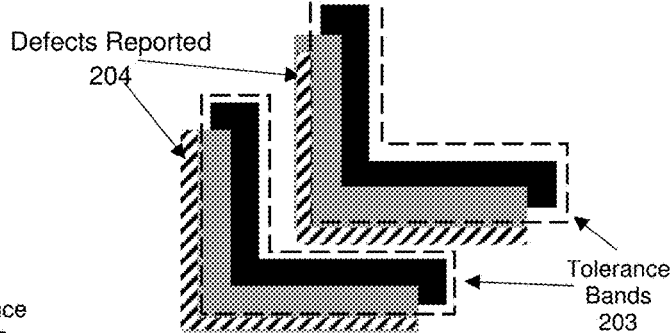

Defects Shown as Regions Where
Scanned Pattern Differs from Reference
Pattern Outside of Tolerance Band
Figure 2D

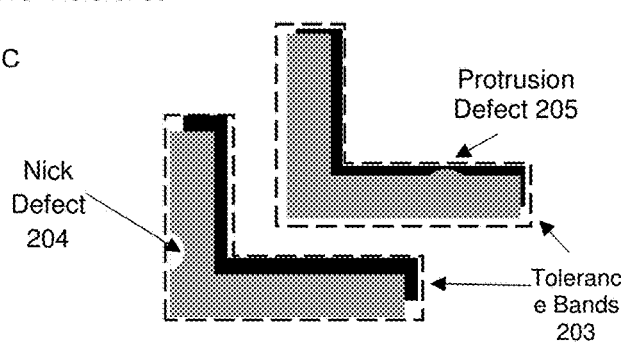

Defects Not Detected Because They Lie Within Tolerance Band
Figure 2E

How Gray Scale Camera Pixels Are Classified as Conductor or Insulator

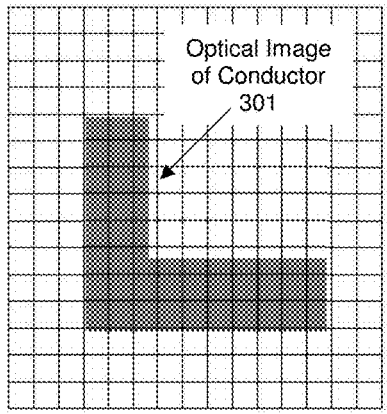

2.7-pixel wide line projected onto camera
with a spatial position such that:
100% 100% 70% 0%

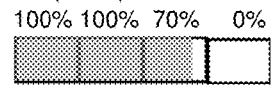

Figure 3A

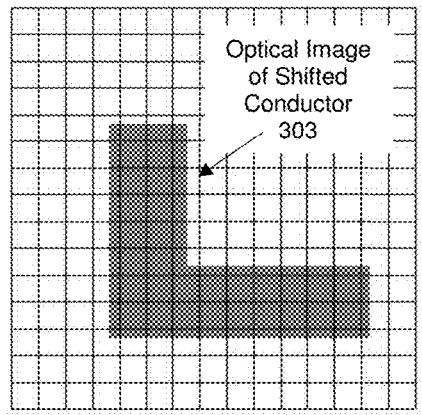

2.7-pixel wide line projected onto camera
with a spatial position such that:
35% 100% 100% 35%

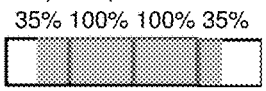

Figure 3C

If illuminated area ≥ 50% then quantized pixel is set equal to conductor (black)
If illuminated area < 50% then pixel is set equal to insulator (white)

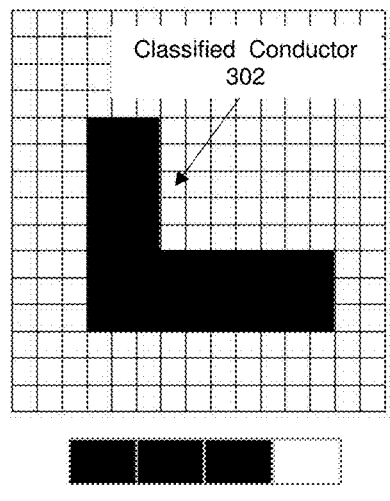

Conductor = 3 pixels wide

How Conductor Image Pixels
of Figure 3A are Classified

Figure 3B

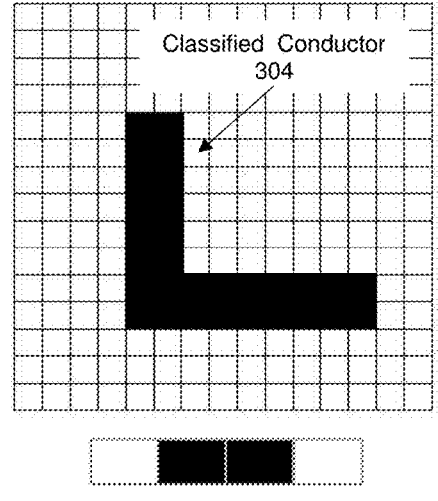

Conductor = 2 pixels wide

How Conductor Image Pixels
of Figure 3C are Classified

Figure 3D

Scanned Image Subsection Compared to CAD Data
Within the same image subsection being compared to Reference data, conductor 401 aligns to Reference data to within +/- 0.1 μm tolerance, but conductor 402 does not and is misaligned by 1 μm due to limitations in the manufacturing placement process.

Vectors Showing the Width of Conductors and Space Between Conductors Measured Along the Entire Length of the Conductors

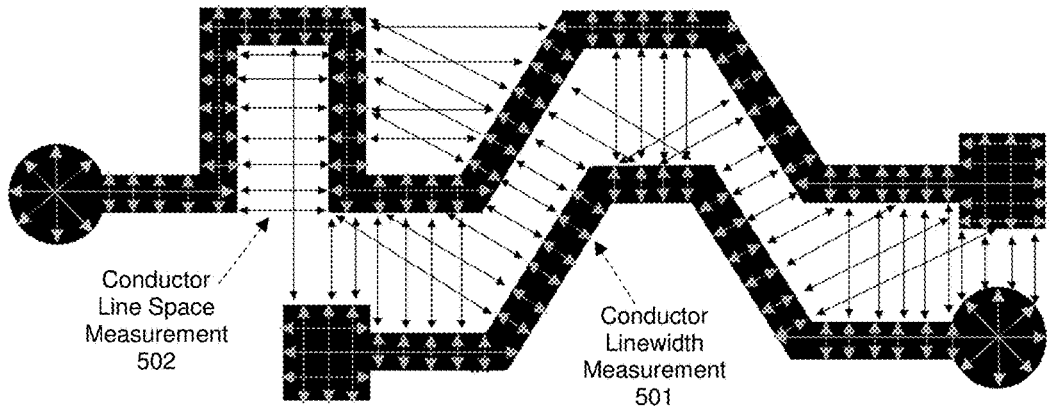

Conductors are black - Spaces are White
Length Vector Measurements in Conductors Shown as Grey Bidirectional Arrows
Length Vector Measurements in Space Between Conductors Shown as Black Bidirectional Arrows

Figure 5

Measurements Are Not Affected by Motion Within the Tolerance Bands

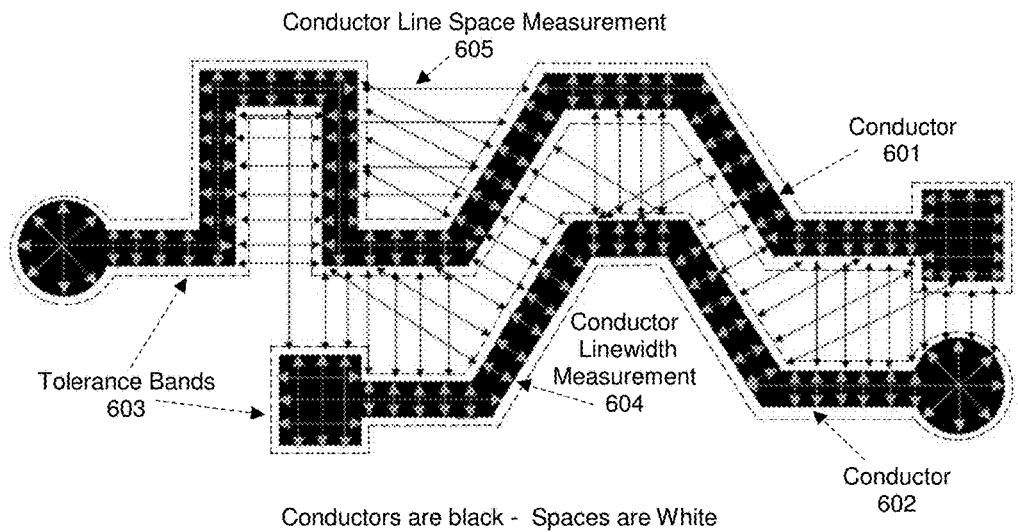

Conductors are black - Spaces are White

Length Vector Measurements in Conductors Shown as Grey Bidirectional Arrows
Length Vector Measurements in Space Between Conductors Shown as Black Bidirectional Arrows Uncertainty Tolerance Band Indicated by Dashed Boundary Lines

Figure 6

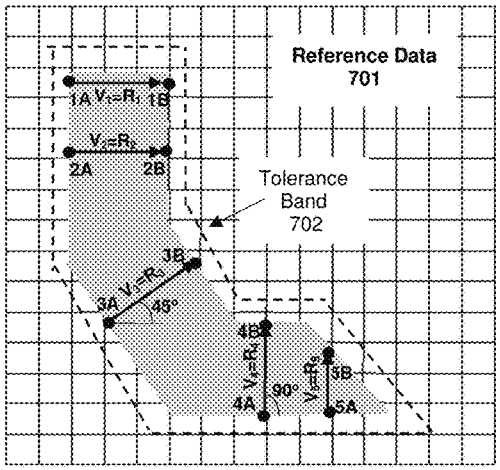

Vector Measurements Computed
from Reference Data

Conductor is Gray, Insulator is White
Reference Data Showing Feature Edges (•)
Computed Length Measurement Vectors →
Angle of Measurement and Tolerance Band ----

Figure 7A

Table 7
List of Measurements Generated
From Reference Data

| Vector | Starting Conductor Edge Position | Ending Conductor Edge Position | Measurement Angle | Length |
|---|---|---|---|---|
| V1 | 1A | 1B | 0 | R1 |
| V2 | 2A | 2B | 0 | R2 |
| V3 | 3A | 3B | 45 | R3 |
| V4 | 4A | 4B | 90 | R4 |
| V5 | 5A | 5B | 90 | R5 |

Figure 7B

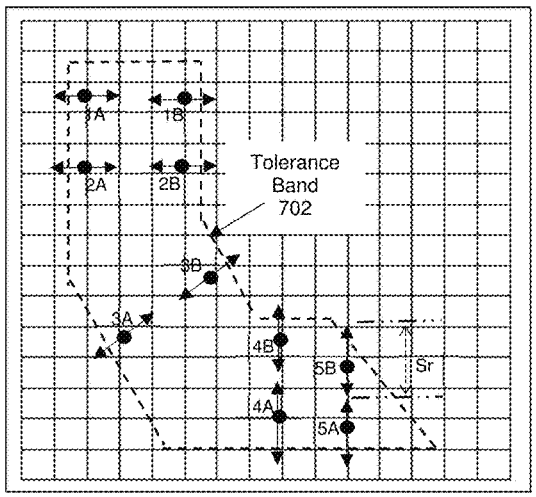

Search Range (Sr ↔) to Find Edges in
Scanned Image

Figure 8

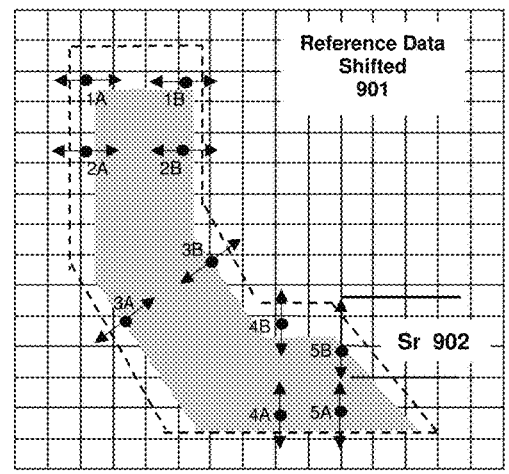

Reference Image shifted ½ box to the right horizontally
and ½ box down vertically from nominal center position

Figure 9

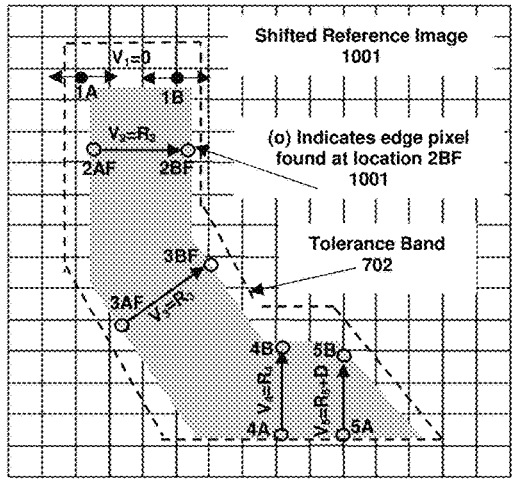

Shifted Reference Showing Feature Edges Found (O) and
Computed Width Vector Measurements →

Figure 10A

| Table 10 List of Measurements Generated From Shifted Reference |||||
|---|---|---|---|---|
| Vector | Starting Conductor Edge Position | Ending Conductor Edge Position | Length | Measurement Angle |
| V1 | not found | not found | 0 | 0 |
| V2 | 2AF | 2BF | R2 | 0 |
| V3 | 3AF | 3BF | R3 | 45 |
| V4 | 4AF | 4BF | R4 | 90 |
| V5 | 5AF | 5BF | R5+D | 90 |

Figure 10B

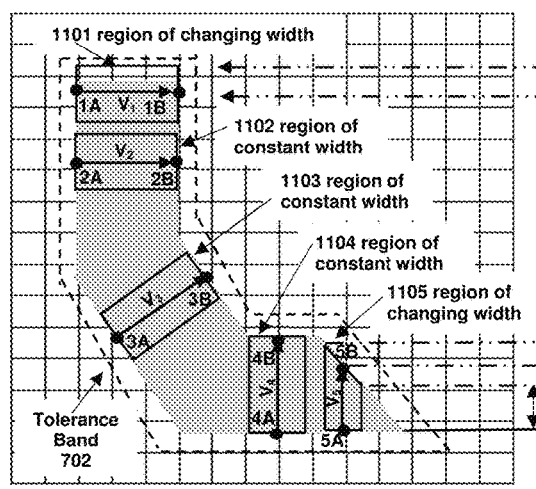

Boundary Box Around Each Vector Indicates
Region of Uncertainty and Shows Range of
Valid Vector Values

Figure 11A

| Table 11 Inspection Parameter List of Conductor Edge Locations, Measurement Angles and Allowable Vector Lengths |||||||
|---|---|---|---|---|---|---|
| Vector | Expected Starting Conductor Edge Position | Expected Ending Conductor Edge Position | Measurement Angle | Length of linear search range to find edge | Minimum Allowable Vector length | Maximum Allowable Vector length |
| V1 | 1A | 1B | 0 | Sr | 0 | R1 |
| V2 | 2A | 2B | 0 | Sr | R2 | R2 |
| V3 | 3A | 3B | 45 | Sr | R3 | R3 |
| V4 | 4A | 4B | 90 | Sr | R4 | R4 |
| V5 | 5A | 5B | 90 | Sr | R5 - D | R5 + D |

Figure 11B

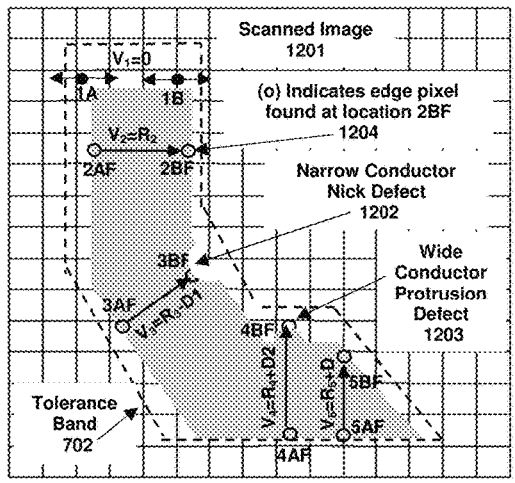

Scanned Image Containing Narrow Line
Defect (V3) and Wide Line Defect (V4)

Figure 12A

| Table 12 Inspection Parameter List and Results of Inspection |||||||||
|---|---|---|---|---|---|---|---|---|
| Inspection Parameter List Used to Inspect Figure 12A  Information Below Generated from Reference Data Prior to Inspection |||||| Results of Inspection Information Below Generated During Inspection |||
| Vector | Expected Starting Conductor Edge Position | Expected Ending Conductor Edge Position | Angle of Measurement | Search Range | Minimum Allowable Vector length | Maximum Allowable Vector length | Vector Found | Measured Vector Length | Classification |
| V1 | 1A | 1B | 0 | Sr | 0 | R1 | no | 0 | OK |
| V2 | 2A | 2B | 0 | Sr | R2 | R2 | yes | R2 | OK |
| V3 | 3A | 3B | 45 | Sr | R3 | R3 | yes | R3-D1 | Defect Narrow Conductor |
| V4 | 4A | 4B | 90 | Sr | R4 | R4 | yes | R4+D2 | Defect Wide Conductor |
| V5 | 5A | 5B | 90 | Sr | R5 - D | R5 + D | yes | R5+D | OK |

Figure 12B

Vector Measurements that Exceed the
Maximum Measurable Distance are
Marked as Such in the Measurement List

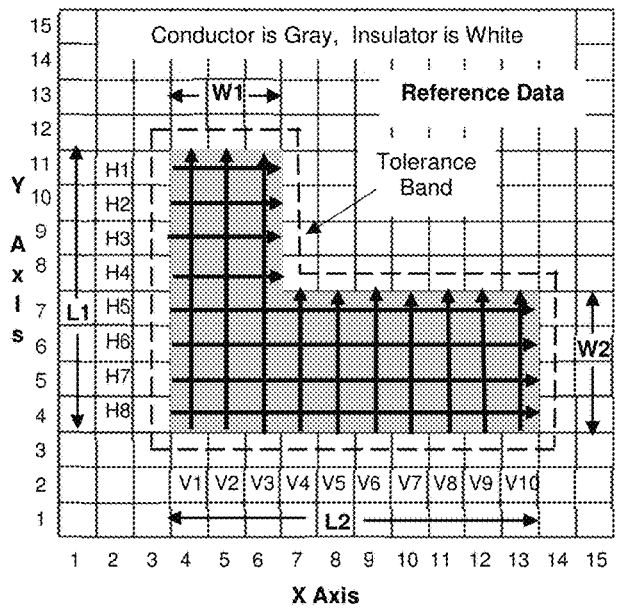

Measurements are Performed Over
the Entire Perimeter of the Feature
with Measurement Spacing as Close
as One Pixel

Figure 14A

Table 14
Inspection Parameter List
List of Measurement Conductor Edge Locations,
Measurement Angles and Allowable Vector Lengths For Figure 14a

| Vector | Exp Starting Conductor Edge Position X,Y | Exp Ending Conductor Edge Position X,Y | Mea Angle | Length search range | Min Vector length | Max Vector length |
|---|---|---|---|---|---|---|
| H1 | 4,11 | 6,11 | 0 | +/-1/2 | 0 | W1 |
| H2 | 4,10 | 6,10 | 0 | +/-1/2 | W1 | W1 |
| H3 | 4,9 | 6,9 | 0 | +/-1/2 | W1 | W1 |
| H4 | 4,8 | 6,8 | 0 | +/-1/2 | W1 | L2 |
| H5 | 4,7 | 13,7 | 0 | +/-1/2 | W1 | L2 |
| H6 | 4,6 | 13,6 | 0 | +/-1/2 | L2 | L2 |
| H7 | 4,5 | 13,5 | 0 | +/-1/2 | L2 | L2 |
| H8 | 4,4 | 13,4 | 0 | +/-1/2 | 0 | L2 |
| V1 | 4,4 | 4,11 | 90 | +/-1/2 | 0 | L1 |
| V2 | 5,4 | 5,11 | 90 | +/-1/2 | L1 | L1 |
| V3 | 6,4 | 6,11 | 90 | +/-1/2 | W2 | L1 |
| V4 | 7,4 | 7,7 | 90 | +/-1/2 | W2 | L1 |
| V5 | 8,4 | 8,7 | 90 | +/-1/2 | W2 | W2 |
| V6 | 9,4 | 9,7 | 90 | +/-1/2 | W2 | W2 |
| V7 | 10,4 | 10,7 | 90 | +/-1/2 | W2 | W2 |
| V8 | 11,4 | 11,7 | 90 | +/-1/2 | W2 | W2 |
| V9 | 12,4 | 12,7 | 90 | +/-1/2 | W2 | W2 |
| V10 | 13,4 | 13,7 | 90 | +/-1/2 | 0 | W2 |

Figure 14B

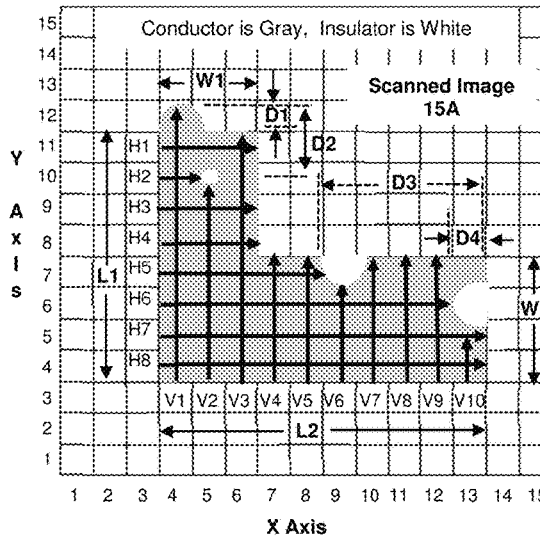

Uncertainty in Scanned Image Placement Does Not Affect or Compromise the Ability to Defect Protrusions, Nicks and Defects Smaller than the Uncertainty Region

Figure 15A

Table 15-1
Inspection Parameter List and Results of Inspection

| Inspection Parameter List Used to Inspect Figure 15A  List Generated From Reference Figure 14A  Inspection Parameters listed in Table 14, Figure 14B | | | | | | Results of Inspection  Information Below Generated During Inspection of Figure 15A | | |
|---|---|---|---|---|---|---|---|---|
| Vector | Exp Starting Conductor Edge Position X,Y | Exp Ending Conductor Edge Position X,Y | Mea Angle | Length search range | Min Vector length | Max Vector length | Vector Found | Measured Vector Length | Classification |
| H1 | 4,11 | 6,11 | 0 | +/-1/2 | 0 | W1 | yes | W1 | OK |
| H2 | 4,10 | 6,10 | 0 | +/-1/2 | W1 | W1 | yes | ½ W1 | Defect Reduced Linewidth |
| H3 | 4,9 | 6,9 | 0 | +/-1/2 | W1 | W1 | yes | W1 | OK |
| H4 | 4,8 | 6,8 | 0 | +/-1/2 | W1 | L2 | yes | W1 | OK |
| H5 | 4,7 | 13,7 | 0 | +/-1/2 | W1 | L2 | yes | L2-D3 (in range) | OK |
| H6 | 4,6 | 13,6 | 0 | +/-1/2 | L2 | L2 |  | L2-D4 | Defect Reduced Linewidth |
| H7 | 4,5 | 13,5 | 0 | +/-1/2 | L2 | L2 | yes | L2 | OK |
| H8 | 4,4 | 13,4 | 0 | +/-1/2 | 0 | L2 | yes | L2 | OK |
| V1 | 4,4 | 4,11 | 90 | +/-1/2 | 0 | L1 | yes | L1+D1 | Defect Wide Conductor |
| V2 | 5,4 | 5,11 | 90 | +/-1/2 | L1 | L1 | yes | L1-D2 | Defect Reduced Linewidth |
| V3 | 6,4 | 6,11 | 90 | +/-1/2 | W2 | L1 | yes | L1 | OK |
| V4 | 7,4 | 7,7 | 90 | +/-1/2 | W2 | L1 | yes | W2 | OK |
| V5 | 8,4 | 8,7 | 90 | +/-1/2 | W2 | W2 | yes | W2 | OK |
| V6 | 9,4 | 9,7 | 90 | +/-1/2 | W2 | W2 | yes | W2-D5 | Defect Reduced Linewidth |
| V7 | 10,4 | 10,7 | 90 | +/-1/2 | W2 | W2 | yes | W2 | OK |
| V8 | 11,4 | 11,7 | 90 | +/-1/2 | W2 | W2 | yes | W2 | OK |
| V9 | 12,4 | 12,7 | 90 | +/-1/2 | W2 | W2 | yes | W2 | OK |
| V10 | 13,4 | 13,7 | 90 | +/-1/2 | 0 | W2 | yes | W2-D6 | OK |

Figure 15B

Table 15-2
Inspection Parameter List With Manufacturing Tolerances Added to Inspect Feature in Figure 15D and Results of Inspection

| | Inspection Parameter List Generated From Reference Figure 14A with Manufacturing Tolerances Added to Table 14 to Inspect Figure 15D | | | | | Results of Inspection Information Below Generated During Inspection of Figure 15D | | |
|---|---|---|---|---|---|---|---|---|
| Vector | Exp Starting Conductor Edge Position X,Y | Exp Ending Conductor Edge Position X,Y | Mea Angle | Length search range | Min Vector length | Max Vector length | Vector Found | Measured Vector Length | Classification |
| H1 | 4,11 | 6,11 | 0 | +/-1/2 | 0 | W1+α | yes | W1 | OK |
| H2 | 4,10 | 6,10 | 0 | +/-1/2 | W1-α | W1+α | yes | ½ W1 | Defect Reduced Linewidth |
| H3 | 4,9 | 6,9 | 0 | +/-1/2 | W1-α | W1+α | yes | W1 | OK |
| H4 | 4,8 | 6,8 | 0 | +/-1/2 | W1-α | L2+β | yes | W1 | OK |
| H5 | 4,7 | 13,7 | 0 | +/-1/2 | W1-α | L2+β | yes | L2 | OK |
| H6 | 4,6 | 13,6 | 0 | +/-1/2 | L2-β | L2+β | | L2-D4 | Defect Reduced Linewidth |
| H7 | 4,5 | 13,5 | 0 | +/-1/2 | L2-β | L2+β | yes | L2 | OK |
| H8 | 4,4 | 13,4 | 0 | +/-1/2 | 0 | L2+β | yes | L2 | OK |
| V1 | 4,4 | 4,11 | 90 | +/-1/2 | 0 | L1+β | yes | L1+D0 | OK within Tolerance |
| V2 | 5,4 | 5,11 | 90 | +/-1/2 | L1-β | L1+β | yes | L1-D2 | Defect Reduced Linewidth |
| V3 | 6,4 | 6,11 | 90 | +/-1/2 | W2-α | L1+β | yes | L1 | OK |
| V4 | 7,4 | 7,7 | 90 | +/-1/2 | W2-α | L1+β | yes | W2 | OK |
| V5 | 8,4 | 8,7 | 90 | +/-1/2 | W2-α | W2+α | yes | W2 | OK |
| V6 | 9,4 | 9,7 | 90 | +/-1/2 | W2-α | W2+α | yes | W2-D8 | OK Within Tolerance |
| V7 | 10,4 | 10,7 | 90 | +/-1/2 | W2-α | W2+α | yes | W2 | OK |
| V8 | 11,4 | 11,7 | 90 | +/-1/2 | W2-α | W2+α | yes | W2 | OK |
| V9 | 12,4 | 12,7 | 90 | +/-1/2 | W2-α | W2+α | yes | W2 | OK |
| V10 | 13,4 | 13,7 | 90 | +/-1/2 | 0 | W2+α | yes | W2-D6 | OK |

Figure 15C

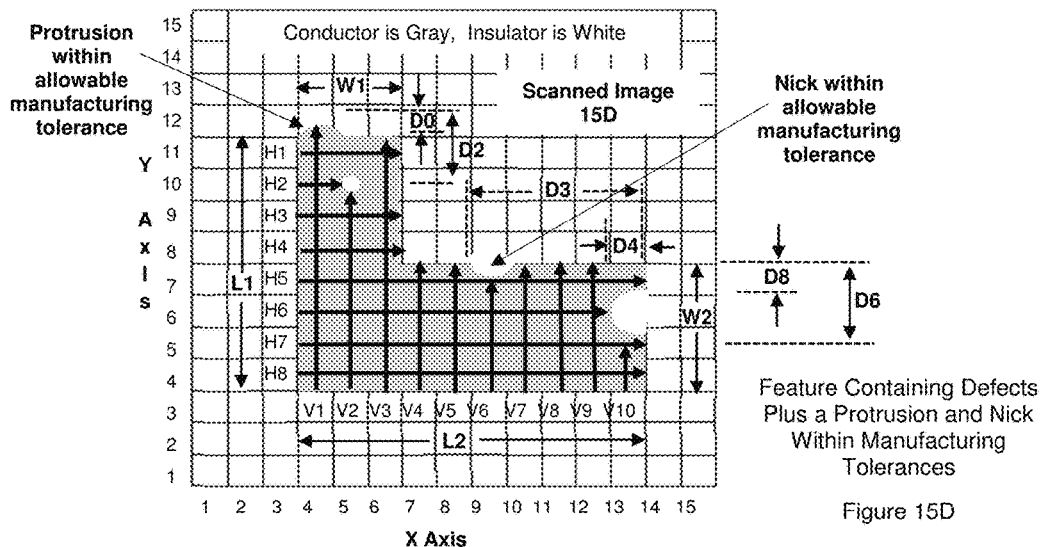

Figure 15D

Feature Containing Defects Plus a Protrusion and Nick Within Manufacturing Tolerances

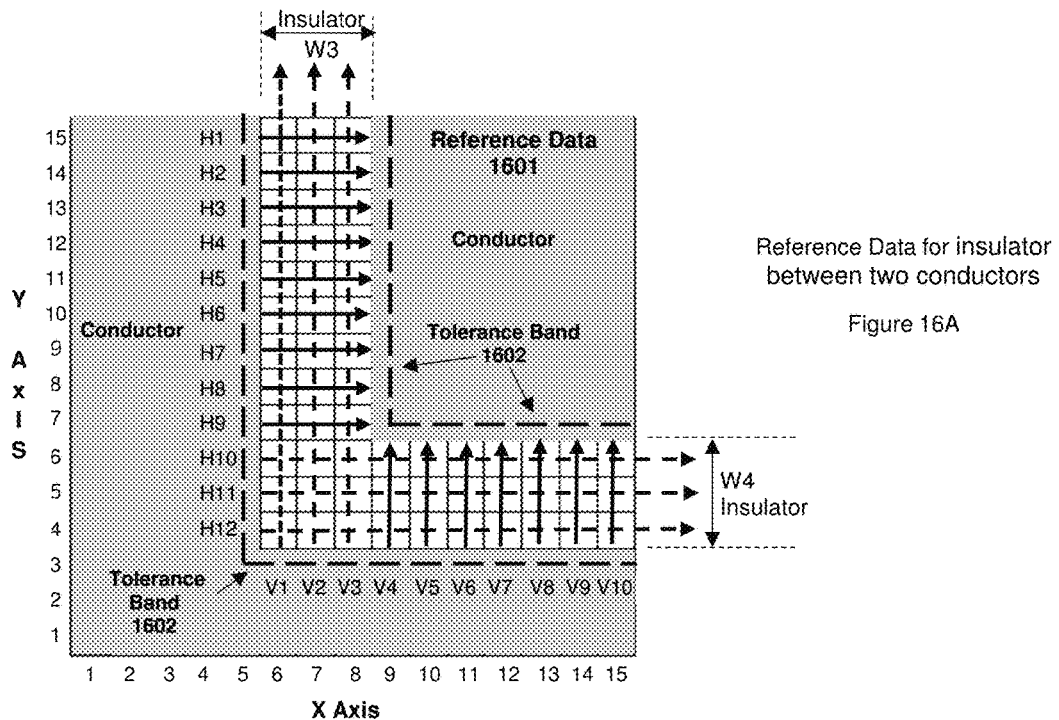

Reference Data for insulator between two conductors

Figure 16A

| Table 16 Inspection Parameter List of Measurement Insulator Edge Locations, Measurement Angles and Allowable Vector Lengths For Figure 16A |||||||
|---|---|---|---|---|---|---|
| Vector | Exp Insulator Starting Edge Position X,Y | Exp Insulator Ending Edge Position X,Y | Mea Angle | Length search range | Min Vector length | Max Vector length |
| H1 | 6,15 | 8,15 | 0 | +/-1/2 | W3 | W3 |
| H2 | 6,14 | 8,14 | 0 | +/-1/2 | W3 | W3 |
| H3 | 6,13 | 6,13 | 0 | +/-1/2 | W3 | W3 |
| H4 | 6,12 | 8,12 | 0 | +/-1/2 | W3 | W3 |
| H5 | 6,11 | 8,11 | 0 | +/-1/2 | W3 | W3 |
| H6 | 6,10 | 8,10 | 0 | +/-1/2 | W3 | W3 |
| H7 | 6,9 | 8,9 | 0 | +/-1/2 | W3 | W3 |
| H8 | 6,8 | 8,8 | 0 | +/-1/2 | W3 | W3 |
| H9 | 6,7 | 8,7 | 0 | +/-1/2 | W3 | $D_{MAX}$ |
| H10 | 6,6 | $D_{MAX}$ | 0 | +/-1/2 | W3 | $D_{MAX}$ |
| H11 | 6,5 | $D_{MAX}$ | 0 | +/-1/2 | $D_{MAX}$ | $D_{MAX}$ |
| H12 | 6,4 | $D_{MAX}$ | 0 | +/-1/2 | 0 | $D_{MAX}$ |
| V1 | 6,4 | $D_{MAX}$ | 90 | +/-1/2 | 0 | $D_{MAX}$ |
| V2 | 7,4 | $D_{MAX}$ | 90 | +/-1/2 | $D_{MAX}$ | $D_{MAX}$ |
| V3 | 8,4 | $D_{MAX}$ | 90 | +/-1/2 | W4 | $D_{MAX}$ |
| V4 | 9,4 | 9,6 | 90 | +/-1/2 | W4 | $D_{MAX}$ |
| V5 | 10,4 | 10,6 | 90 | +/-1/2 | W4 | W4 |
| V6 | 11,4 | 11,6 | 90 | +/-1/2 | W4 | W4 |
| V7 | 12,4 | 12,6 | 90 | +/-1/2 | W4 | W4 |
| V8 | 13,4 | 13,6 | 90 | +/-1/2 | W4 | W4 |
| V9 | 12,4 | 12,7 | 90 | +/-1/2 | W4 | W4 |
| V10 | 13,4 | 13,7 | 90 | +/-1/2 | W4 | W4 |

Figure 16B

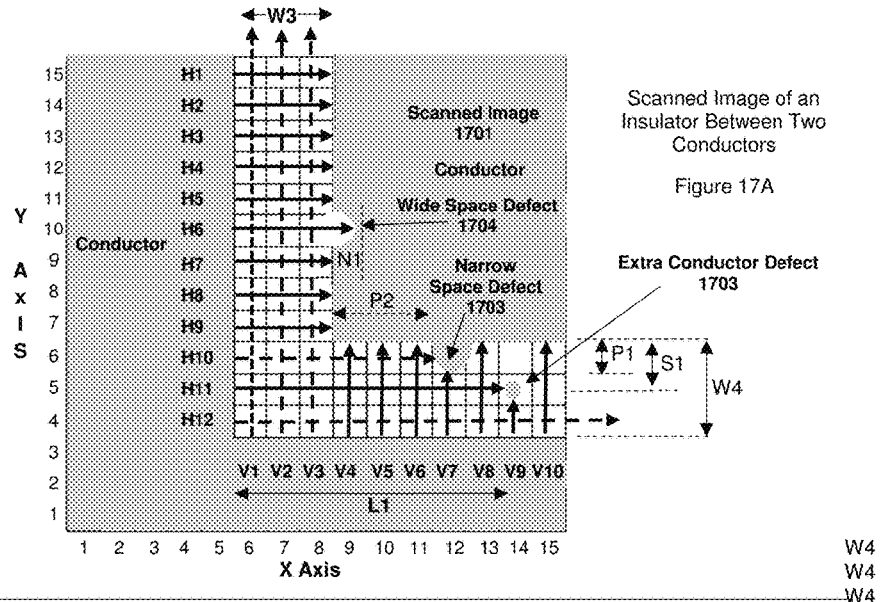

Scanned Image of an Insulator Between Two Conductors

Figure 17A

Table 17
Inspection Parameter List Used to Inspect Feature in Figure 16A and Results of Inspection

| Vector | Inspection Parameter List — Inspection List From Table 16 — Generated From Reference Figure 16A | | | | | | Results of Inspection — Information Below Generated During Inspection of Figure 17a | | |
|---|---|---|---|---|---|---|---|---|---|
| | Exp Insulator Starting Edge Position X,Y | Exp Insulator Ending Edge Position X,Y | Mea Angle | Length search range | Min Vector length | Max Vector length | Vector Found | Measured Vector Length | Classification |
| H1 | 6,15 | 8,15 | 0 | +/-1/2 | W3 | W3 | yes | W3 | |
| H2 | 6,14 | 8,14 | 0 | +/-1/2 | W3 | W3 | yes | W3 | |
| H3 | 6,13 | 6,13 | 0 | +/-1/2 | W3 | W3 | yes | W3 | |
| H4 | 6,12 | 8,12 | 0 | +/-1/2 | W3 | W3 | yes | W3 | |
| H5 | 6,11 | 8,11 | 0 | +/-1/2 | W3 | W3 | yes | W3 | |
| H6 | 6,10 | 8,10 | 0 | +/-1/2 | W3 | W3 | yes | W3+N1 | Defect Wide Insulator |
| H7 | 6,9 | 8,9 | 0 | +/-1/2 | W3 | W3 | yes | W3 | |
| H8 | 6,8 | 8,8 | 0 | +/-1/2 | W3 | W3 | yes | W3 | |
| H9 | 6,7 | 8,7 | 0 | +/-1/2 | W3 | $D_{MAX}$ | yes | W3 | |
| H10 | 6,6 | $D_{MAX}$ | 0 | +/-1/2 | W3 | $D_{MAX}$ | yes | W3+P2 | OK (in range) |
| H11 | 6,5 | $D_{MAX}$ | 0 | +/-1/2 | $D_{MAX}$ | $D_{MAX}$ | yes | L1 | Defect Narrow Insulator |
| H12 | 6,4 | $D_{MAX}$ | 0 | +/-1/2 | 0 | $D_{MAX}$ | yes | $D_{MAX}$ | |
| V1 | 6,4 | $D_{MAX}$ | 90 | +/-1/2 | 0 | $D_{MAX}$ | yes | $D_{MAX}$ | |
| V2 | 7,4 | $D_{MAX}$ | 90 | +/-1/2 | $D_{MAX}$ | $D_{MAX}$ | yes | $D_{MAX}$ | |
| V3 | 8,4 | $D_{MAX}$ | 90 | +/-1/2 | W4 | $D_{MAX}$ | yes | $D_{MAX}$ | |
| V4 | 9,4 | 9,6 | 90 | +/-1/2 | W4 | $D_{MAX}$ | yes | $D_{MAX}$ | |
| V5 | 10,4 | 10,6 | 90 | +/-1/2 | W4 | W4 | yes | W4 | |
| V6 | 11,4 | 11,6 | 90 | +/-1/2 | W4 | W4 | yes | W4 | |
| V7 | 12,4 | 12,6 | 90 | +/-1/2 | W4 | W4 | yes | W4-P1 | Defect Narrow Insulator |
| V8 | 13,4 | 13,6 | 90 | +/-1/2 | W4 | W4 | yes | W4 | |
| V9 | 12,4 | 12,7 | 90 | +/-1/2 | W4 | W4 | yes | W4-S1 | Defect Narrow Insulator |
| V10 | 13,4 | 13,7 | 90 | +/-1/2 | W4 | W4 | yes | W4 | |

Figure 17B

Signals and Images Used to Find Edges of Conductors and Insulators to Sub-Pixel
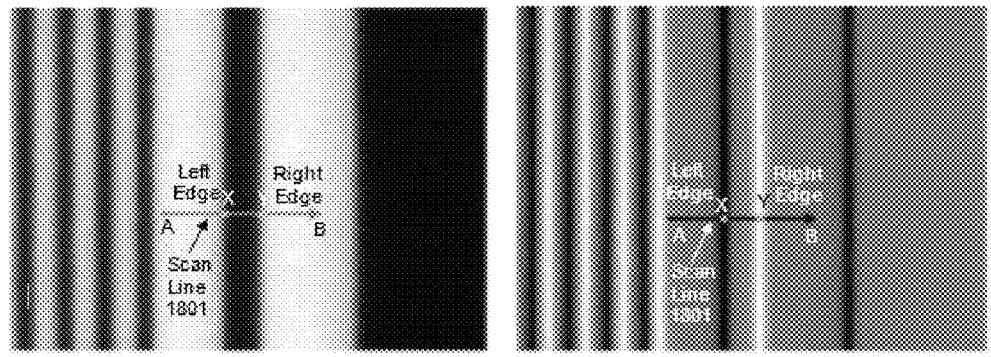
Scanned Fluorescent Image
Conductors are Dark, Insulators are Bright
Figure 18A
Output of Edge Filter
Figure 18B
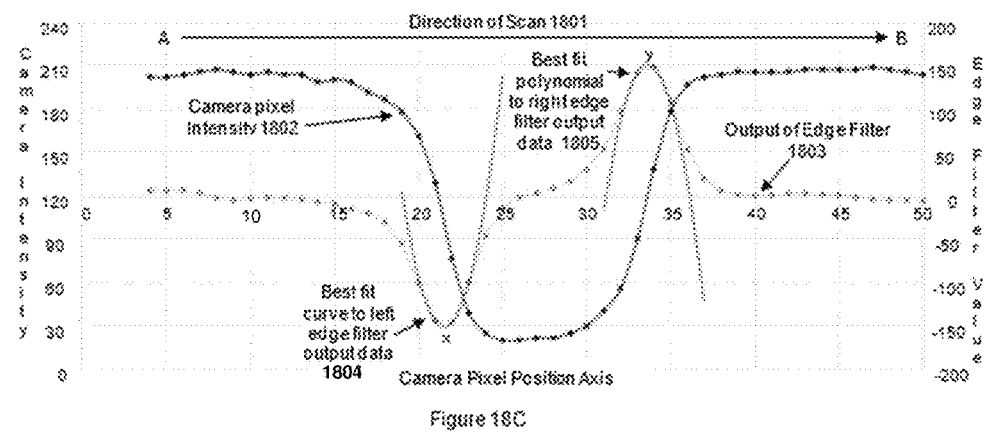
Figure 18C
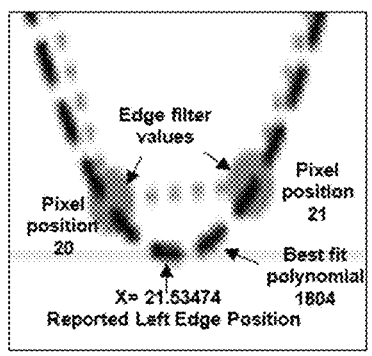
Figure 18D
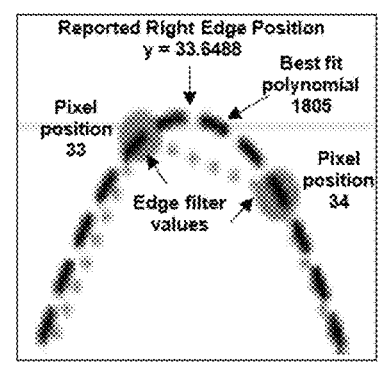
Figure 18E Scanned Chrome on Glass Gray Scale Image of Test Target 1

| Results of Measuring Linewidths on Test Target 1 Using Sobel Gradient Algorithm ||
| Known Reference Line Width on Target | Measured Line Width Using Sobel Edge Filter and Best Fit Parabolic Curve |
| --- | --- |
| 2.20 um (228 lp/mm) | 2.20 um +/- 0.035 um |
| 2.46 um (203 lp/mm) | 2.46 um +/- 0.035 um |

Method 1 for Conversion of CAD Data to Reference Gray Scale Pixels

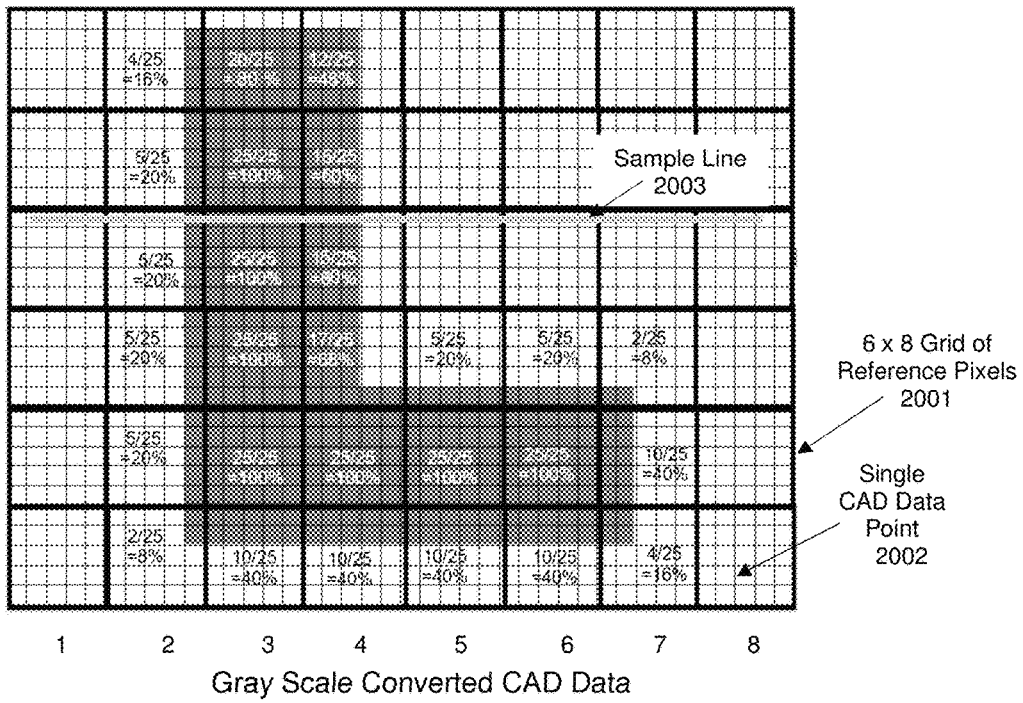

Gray Scale Converted CAD Data

1. Large Reference Square equals size of camera pixel
2. Small square equals resolution of CAD data
3. Each Reference Pixel contains 25 CAD data points
4. Gray scale intensity value of Reference Pixel (represented by large square) is proportional to percent of Reference Pixel area filled by conductor.

Figure 20A

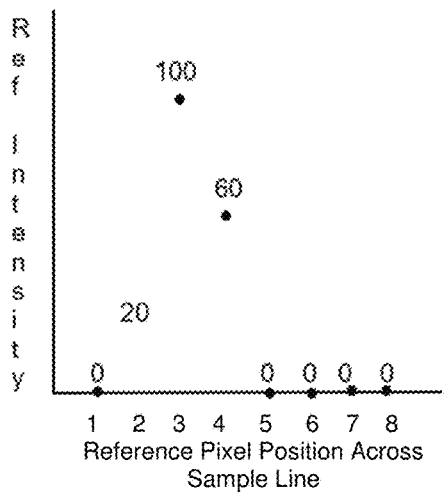

Reference Pixel Position Across Sample Line

Figure 20B

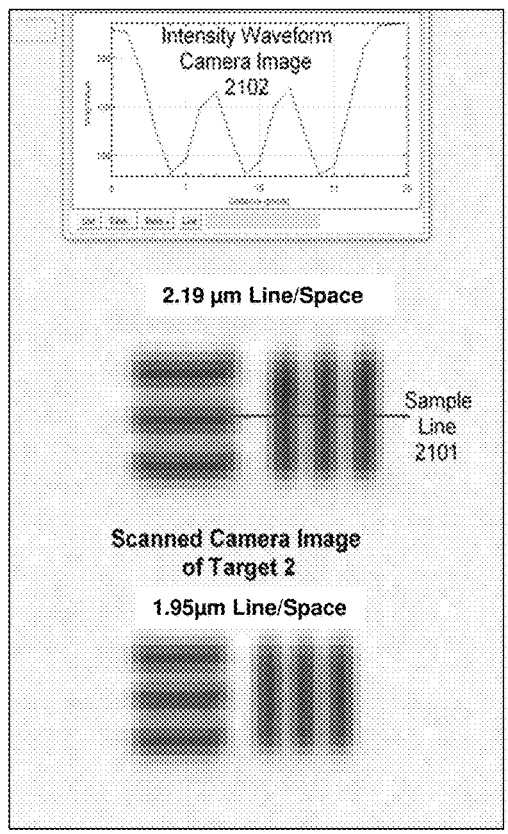
Figure 21A
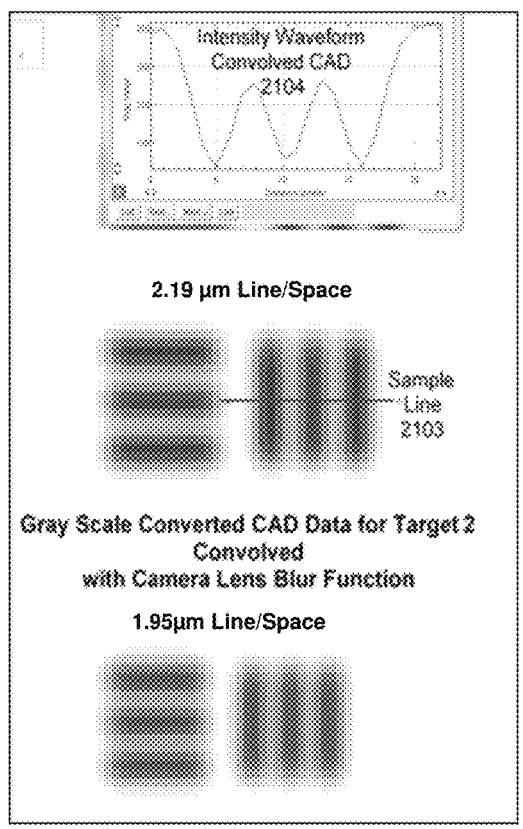
Figure 21B
| Table 21C<br>Linewidth Difference Measured Between<br>CAD Data Convolved With Lens Blur Function (Figure 21B)<br>and Scanned Camera Image (Figure 21A) ||
| --- | --- |
| Known Line Width /Space From CAD Data | Difference Measured Between CAD Data Convolved With Lens Blur Function (Figure 21A) and Scanned Camera Image (Figure 21B) |
| 2.19 μm | +/- 0.1 μm |
| 1.95 μm | +/- 0.1 μm |
Figure 21C

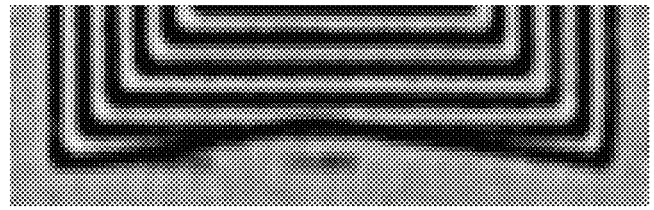

Scanned Fluorescent Image of Metal Conductors, which Appear Black, on a Bright Fluorescing Substrate
Figure 22A

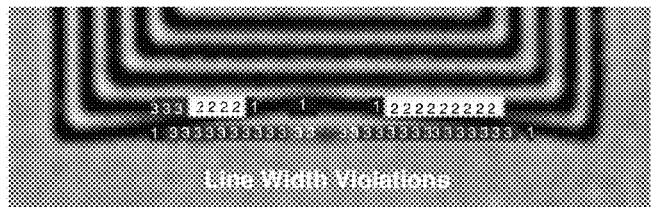

| -Tolerance < Good < +Tolerance<br>Tolerance < number 1 < 2xTolerance<br>2x Tolerance < number 2<br>number 3 = Not found in 2.1 um search range | -1.8 um < Good < 2.2 um<br>1.6 um < number 1 < 1.8 um or<br>2.2um < number 1 < 2.4um<br>2 < 1.6 um or 2.4 < number 2<br>number 3 = Not found in 2.1 |
|---|---|

Line Width Violations
Figure 22B

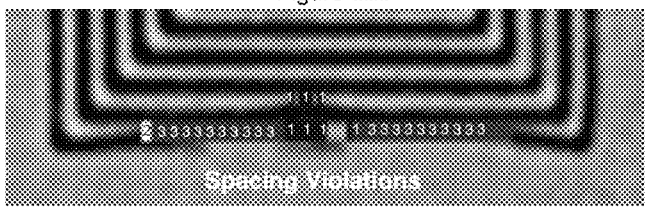

| -Tolerance < Good < +Tolerance<br>Tolerance < number 1 < 2xTolerance<br>2x Tolerance < number 2<br>number 3 = Not found in 2.1 um search range | -1.8 um < Good < 2.2 um<br>1.6 um < number 1 < 1.8 um or<br>2.2um < number 1 < 2.4um<br>2 < 1.6 um or 2.4 < number 2<br>number 3 = Not found in 2.1 |
|---|---|

Spacing Violations
Figure 22C

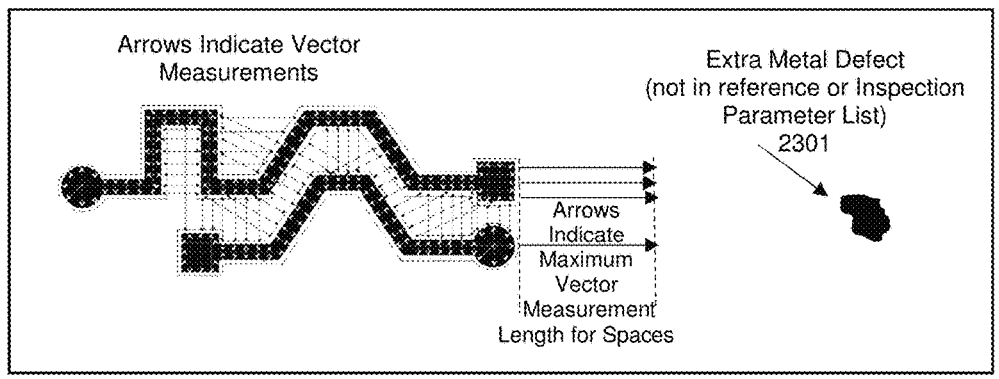

Extra Metal Defect Not in Reference Data
Figure 23

Extra Metal Defect in Large Area of Insulator

Extra Metal Defects

Hole Defect in Large Area of Metal

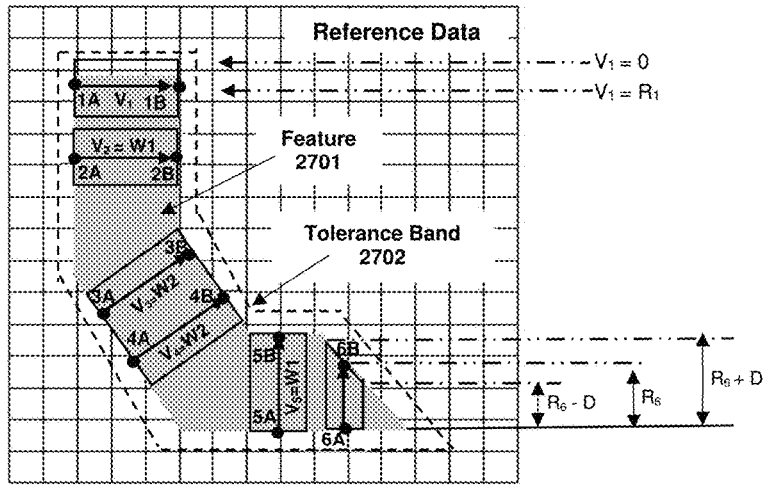

Boundary Box Around Each Vector Indicates Region of Uncertainty and Shows Range of Vector Values Vectors V2, V3, V4, V5 Are Used to Measure Critical Feature Width Because They Do Not Change Value as Feature Moves Within Region of Uncertainty Critical Width Vectors V2 and V5 have the same value = W1

Critical Width Vectors V3 and V4 have the same value = W2

Figure 27A

Table 27
**Measurement Parameter List For Feature Shown in Figure 27A
Indicating Critical Width Vectors**

List of Conductor Edge Locations, Measurement Angles
Vector Lengths and Critical Width Vectors Generated From Reference Data to be used for
Statistical Measurements When Inspecting a Scanned Part

| Vector | Expected Starting Conductor Edge Position | Expected Ending Conductor Edge Position | Measurement Angle | Length of linear search range to find edge | Minimum Allowable Vector length | Maximum Allowable Vector length | Critical Width Vector |
|---|---|---|---|---|---|---|---|
| V1 | 1A | 1B | 0 | Sr | 0 | R1 | No |
| V2 | 2A | 2B | 0 | Sr | W1 | W1 | Yes |
| V3 | 3A | 3B | 45 | Sr | W2 | W2 | Yes |
| V4 | 4A | 4B | 90 | Sr | W2 | W2 | Yes |
| V5 | 5A | 5B | 90 | Sr | W1 | W1 | Yes |
| V6 | 6A | 6B | 90 | Sr | R6 - D | R6 + D | No |

Figure 27B

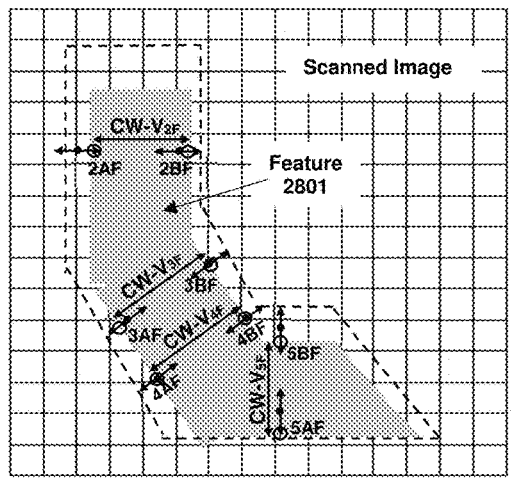

Scanned Image of Part
Showing Feature Edges Found (O)
and Computed Critical Width Vector (CWV)
Measurements

Figure 28A

| Table 28-1 Critical Width Vector Measurements Computed From Feature in Scanned Image of Figure 28A ||||||
|---|---|---|---|---|---|
| Vector | Starting Conductor Edge Position Found | Ending Conductor Edge Position Found | Measurement Angle | Width Measured in Scanned Image and Used to Compute Statistical Data | Design Width from Reference Data |
| CW-$V_{2F}$ | 2AF ($2_{AX}$,$2_{AY}$) | 2BF ($2_{BX}$,$2_{BY}$) | 0 | CW-$V_{2F}$ = $\sqrt{(2_{AX}-2_{BX})^2 + (2_{AY}-2_{BY})^2}$ | W1 |
| CW-$V_{3F}$ | 3AF ($3_{AX}$,$3_{AY}$) | 3BF ($3_{BX}$,$3_{BY}$) | 45 | CW-$V_{3F}$ = $\sqrt{(3_{AX}-3_{BX})^2 + (3_{AY}-3_{BY})^2}$ | W2 |
| CW-$V_{4F}$ | 4AF ($4_{AX}$,$4_{AY}$) | 4BF ($4_{BX}$,$4_{BY}$) | 90 | CW-$V_{4F}$ = $\sqrt{(4_{AX}-4_{BX})^2 + (4_{AY}-4_{BY})^2}$ | W2 |
| CW-$V_{5F}$ | 5AF ($5_{AX}$,$5_{AY}$) | 5BF ($5_{BX}$,$5_{BY}$) | 90 | CW-$V_{5F}$ = $\sqrt{(5_{AX}-5_{BX})^2 + (5_{AY}-5_{BY})^2}$ | W1 |

Figure 28B

| Table 28-2 ||||
|---|---|---|---|---|
| Statistical Data Computed From Critical Width Vector Measurements for the Feature in Figure 28A |||||
| Design Width Reference Data | Minimum | Average | Maximum | Standard Deviation STD |
| W1 | Minimum value of all Critical Width Vectors measured whose design width in the Reference Data is supposed to be W1 | Average value of all Critical Width Vectors measured whose design width in the Reference Data is supposed to be W1 | Minimum value of all Critical Width Vectors measured whose design width in the Reference Data is supposed to be W1 | Standard Deviation of all Critical Width Vectors measured whose design width in the Reference Data is supposed to be W1 |
| W2 | Minimum value of all Critical Width Vectors measured whose design width in the Reference Data is supposed to be W2 | Average value of all Critical Width Vectors measured whose design width in the Reference Data is supposed to be W2 | Minimum value of all Critical Width Vectors measured whose design width in the Reference Data is supposed to be W2 | Standard Deviation of all Critical Width Vectors measured whose design width in the Reference Data is supposed to be W2 |

Figure 28C

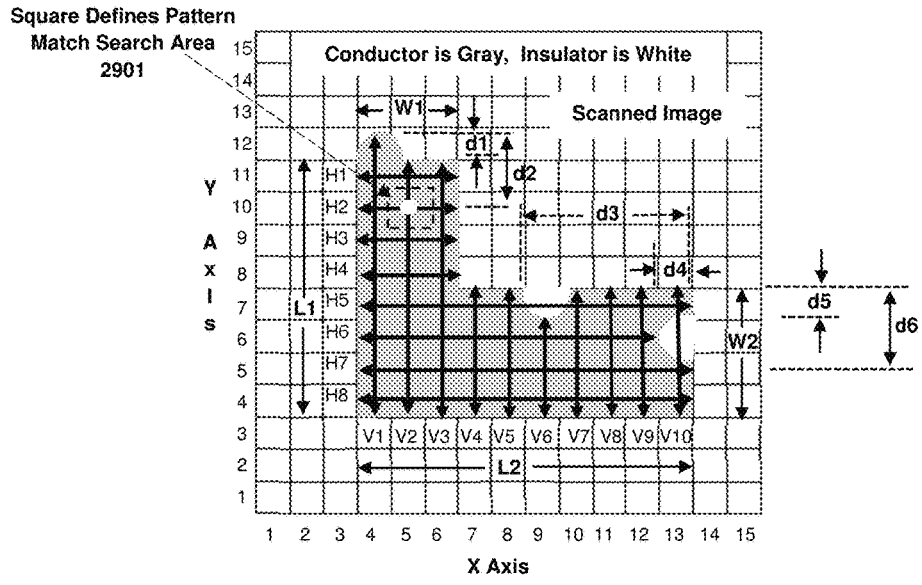

Scanned Image Compared to Reference Data and with
Measurement Vectors Extending to Opposite sides of the Feature

Figure 29

Reference Data Showing Elliptical Pad
Edge Pixels and Vectors

Reference Data Showing Elliptical Pad
Edge Pixels and Search Ranges (Sr)

Reference Data Showing
Expected Edge Pixel Locations
and Search Ranges to be Used to Locate
Ellipse in the Scanned Data

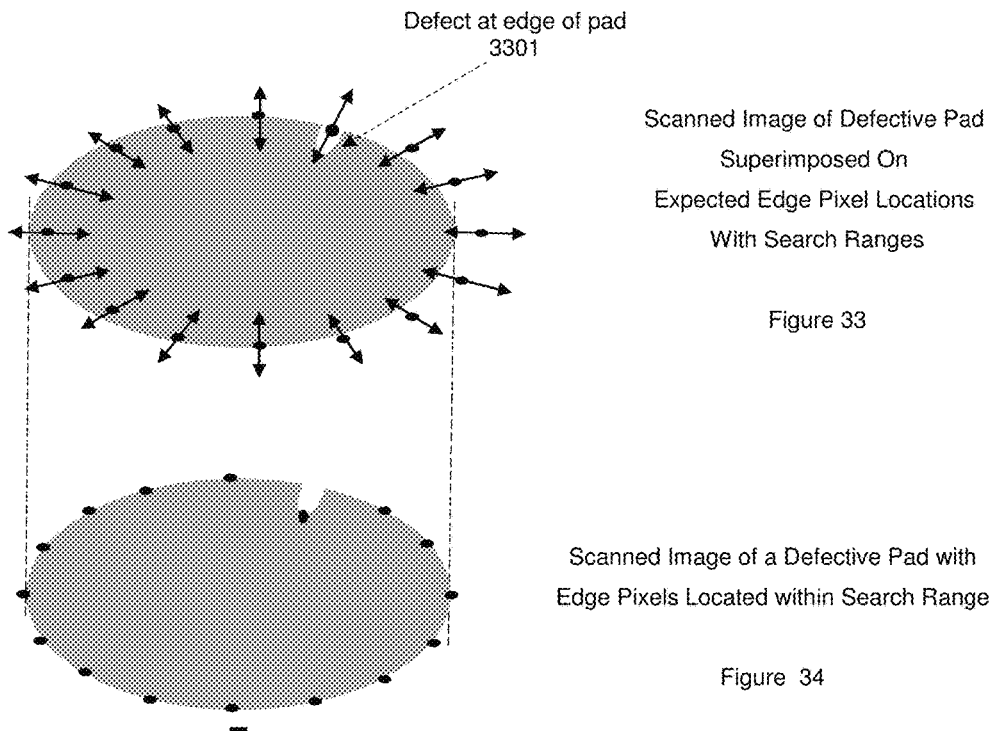

Defect at edge of pad
3301

Scanned Image of Defective Pad
Superimposed On
Expected Edge Pixel Locations
With Search Ranges

Figure 33

Scanned Image of a Defective Pad with
Edge Pixels Located within Search Range

Figure 34

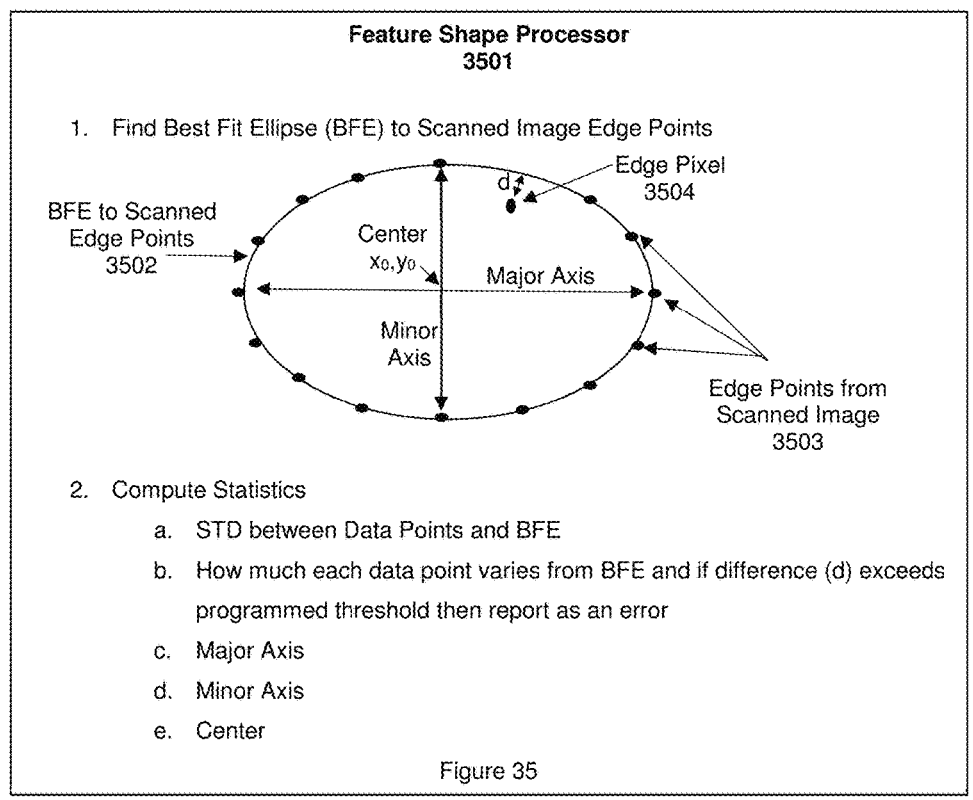

Feature Shape Processor
3501

1. Find Best Fit Ellipse (BFE) to Scanned Image Edge Points

BFE to Scanned Edge Points 3502
   Edge Pixel 3504
   Center $x_0, y_0$
   Major Axis
   Minor Axis
   Edge Points from Scanned Image 3503

2. Compute Statistics
   a. STD between Data Points and BFE
   b. How much each data point varies from BFE and if difference (d) exceeds programmed threshold then report as an error
   c. Major Axis
   d. Minor Axis
   e. Center

Figure 35

System Block Diagram

COMPENSATING FOR REFERENCE MISALIGNMENT DURING INSPECTION OF PARTS

CROSS-REFERENCE TO RELATED APPLICATIONS

This application claims the benefit of a U.S. Provisional Patent Application Ser. No. 62/744,746 entitled "SUB MICRON INSPECTION" filed Oct. 12, 2018, the entire contents of which are hereby incorporated by reference.

TECHNICAL FIELD

This patent relates to optical inspection and/or metrology of components such as semiconductor wafers, high-density circuit boards, multi-layer substrates, inner-layer substrates, chrome on glass masks, and other precision parts.

BACKGROUND

Consider an example precision part such as a multi-layer semiconductor or circuit boards with numerous die as shown in FIG. 1A. Such parts are typically manufactured by laminating together multiple layers, each containing metallic conductors. Each layer is fabricated by first coating the layer with resist and then optically projecting, at different locations or sections of the layer, an image containing one or multiple die and then etching the metal to form the desired metallic circuit conductors. This procedure is typically referred to as a project, step and repeat process. Due to current manufacturing limitations, the placement of the projected patterns is known to vary slightly between the same layer design manufactured at different times or even between layers in the same manufacturing lot. This is especially true for large circuit panels manufactured on thin flexible organic substrates, some of which are currently on the order of 500 millimeters×500 millimeters in size.

To facilitate the manufacture and optical inspection of all the die on the substrate, alignment marks are frequently placed in each individual die pattern. During the inspection process the substrate is typically scanned either by mechanically moving the substrate beneath an inspection camera or moving the camera over the substrate, or some combination thereof. Alignment marks, or unique conductor patterns within each die or die subsection, are located in the scanned images and used to align the scanned images to stored reference images of a good die or die subsection. Once aligned, the images are superimposed, and defects are reported in those locations where the stored reference and scanned camera images differ. As an example, FIG. 1B illustrates a reference image of a conductor, shown in black. FIG. 1C illustrates a scanned camera image of a conductor, shown in gray, with a hole 101. FIG. 1D illustrates a perfect superposition of the scanned camera image of FIG. 1C placed over the reference image of FIG. 1B. Hole 101 is detected as a defect where the superimposed images differ.

SUMMARY

Problem Recognition

Detecting defects by superimposing scanned images over reference images has numerous limitations which are now described using FIGS. 2A through 2D, 3A through 3D and 4. As a first example, FIG. 2A shows a reference pattern 201 for a known good circuit (shown in black) and FIG. 2B shows a scanned camera image of this pattern 202 (shown in gray) superimposed over the reference.

Inaccuracies in the scanned image resulting from limitations in the manufacturing process, non-linearities in the imaging optics, stage vibrations, and stage non-linearities, limits the accuracy of this comparison and therefore the size of the smallest detectable defect. As a result, when the scanned and reference images are superimposed, there are regions that do not perfectly match. To accommodate for such mismatch, prior art systems define an error tolerance band or bands such that only pattern differences larger than a minimum size are reported. Such tolerance bands 203 are illustrated by the dashed perimeter boundary lines in FIGS. 2A through 2E. Only when the scanned pattern falls outside the tolerance bands, as shown in FIG. 2C, are defects 204 reported as shown in FIG. 2D.

Camera pixel quantization is another factor that limits how accurately the scanned image and reference pattern can be compared, thus limiting the size of the smallest detectable defect. In many prior art systems, such as in U.S. Pat. No. 6,427,024 to Bishop, entitled "Apparatus for and method of automatic optical inspection of electronic circuit boards, wafers and the like for defects, using skeletal reference inspection and programmable alignment tolerance and detection parameters", the inspection process involves first classifying each camera pixel in the scanned image as conductor or insulator, and then processing the classified pixels to enable comparison to a reference image. As an example of camera pixel quantization, FIG. 3A represents the optical image of a conductor 301, equal to 2.7 camera pixels in width, projected onto an imaging camera. Individual camera pixels are represented by the 2-dimensional grid. In this example, pixels are classified as conductor, if fifty percent or more of a pixel ($P \geq 50\%$) is illuminated with an intensity characteristic of conductor. If less than fifty percent of the pixel is illuminated ($P<50\%$) with this intensity, the pixel is classified as substrate. In FIG. 3A, the left edge of conductor 301 covers one-hundred percent (100%) of pixel 1 (the leftmost pixel in the row), one-hundred percent (100%) of pixel 2 (the next pixel to the right), and seventy percent (70%) of pixel 3 (the pixel in the third column). Therefore, using the 50% threshold rule, conductor 301 is classified as being three (3) camera pixels in width, as shown by classified conductor 302 in FIG. 3B. If, however, the conductor pattern projected onto the camera shifts only a fraction of a pixel to the right, as represented by conductor 303 in FIG. 3C, the same conductor will now be classified as only being two (2) camera pixels in width, as represented by conductor 304 in FIG. 3D. This reduction in classified linewidth occurs because the image of conductor 303, in FIG. 3C, now covers thirty-five percent (35%) of camera pixel 1, one-hundred percent of camera pixels 2 and 3, and thirty-five percent (35%) of camera pixel 4, such that only pixels two (2) and three (3) illuminate more than fifty percent of the pixel. Therefore, as illustrated by FIGS. 3A through 3D, the position of the conductor relative to the pixels in the camera can significantly alter the measured width of a conductor by an entire camera pixel further contributing to differences when the scanned and reference image are compared.

To minimize the number of false calls caused by such differences and misalignment of the scanned and reference images as illustrated in FIGS. 2A through 2D, prior art systems increase the size of the tolerance band to decrease the sensitivity of comparison. Unfortunately, when this is done, real defects appearing in the tolerance band will be missed. As an example, a small nick defect 204 and a small protrusion defect 205, both illustrated in FIG. 2E will not be detected. Missing such defects is a major limitation of prior art systems.

Another limitation of detecting defects by superimposing a scanned and reference image is the inability to inspect for, or verify, conductor line width to a precision finer than the alignment accuracy of the scanned and reference images.

As an example, consider a circuit with two micron (2 μm) lines represented by conductors 401 and 402 in FIG. 4, with both conductors being in the same camera field of view. Conductor 401, in the scanned image aligns with conductor 405, in the reference to within 0.1 μm, as indicated by misalignment arrow 406, whereas conductor 402 in the same scanned image aligns with conductor 407, in the same reference image, to within 1 μm as indicated by misalignment arrow 408. In this example, the scanned image meets manufacturing requirements in that the linewidth of both conductors 401 and 402 are correct to within +/−0.1 μm, which is required to control high frequency impedance and meet electrical requirements, and the spatial misalignment between the scanned and reference images is correct to within 1.0 μm, which is required to insure alignment of circuitry between different layers of a product.

However, using the prior art inspection methods, if the tolerance bands are placed within +/−0.1 μm of reference conductors 405 and 407 to check for proper linewidth, the 1.0 μm misalignment of scanned image conductor 402 relative to reference conductor 407 will be incorrectly reported as an error. If the tolerance bands are placed 1.0 μm away from reference conductors 405 and 407 to check for conductor misalignment, then errors in linewidth of conductors 401 and 402 less than 1.0 μm will not be detected. Thus, as stated above, prior art systems which superimpose a scanned and reference image cannot verify conductor line width to a precision finer than the alignment accuracy of the scanned and reference images.

When the number of required conductors to be measured are small, the prior art has developed automated systems to measure linewidths and critical dimensions at "sampled locations" on a part. Examples of such systems are the Orbotech® Discovery II, Orbotech Fusion and Orbotech Ultra Fusion with 2D metrology capability available from Orbotech Ltd. of Yavne, Israel. (Orbotech is a registered trademark of Orbotech Ltd.) However, unless a defect should occur exactly at one of the predetermined sampled locations, the defect will not be detected. Since the locations of defects are unknown, such sample based systems are generally intended for process control and are not suitable or intended for detection of random defects. For example, a 300 millimeter round wafer scanned using a 0.7 μm camera pixel contains over $1.4 \times 10^{11}$ pixels. Measuring conductor widths and critical dimensions at every location on such a part using such a prior art technology to detect defects would take many hours, if not days. Such prior art technologies are therefore not capable of meeting current day inspection throughput requirements.

In comparison, the methods and systems described herein can inspect a part, perform metrology measurements, and calculate feature size statistics, by measuring conductor linewidth and spacing, to sub-micron accuracies, along the entire length or perimeter of every conductor in a part, in real time as the part is scanned at production speeds and without requiring fine alignment of a scanned image to a stored reference pattern.

Due to the enormous number of measurements that are performed, a self-learning automated algorithm to extract measurement values from a reference file, add manufacturing tolerances, and determine optimal locations to perform critical dimension measurements, is also described.

SUMMARY OF PREFERRED EMBODIMENTS

In one embodiment, a method or system for inspecting features in a part for defects includes locating Reference Data, and then defining tolerance band(s) that specify how much one or more features may spatially deviate from the Reference Data. So-called measurement vectors are then created at fixed spatial locations around a perimeter of each feature. Each measurement vector represents a dimension of the feature in the Reference Data from a point on the perimeter to another point on the perimeter at a specified angle. A linear search range is also defined around each fixed spatial location to enable finding of starting and ending points for each measurement vector. Each linear search range has a search axis oriented in a same angular orientation as its corresponding measurement vector.

Next, for each feature to be inspected, the feature is moved to a plurality of positions within the feature's tolerance band. For each such position of the feature, at each previously created spatially fixed measurement location, points are searched for along the perimeter of the feature within the specified search range. When a point is found on the perimeter, a vector dimension is measured, at the angle specified by the corresponding measurement vector. The resulting dimension is stored as being allowable. When a vector measurement exceeds a maximum measurable value or when no points are found on the perimeter this result is also stored as being allowable. For each spatially fixed measurement location, allowable minimum and maximum vector dimensions are stored, corresponding to the plurality of positions of the feature within its tolerance band. These minimum and maximum vector dimensions, or representations thereof, are then modified to allow for acceptable process variations during inspection of a part.

The process for inspecting a part from a scanned image then continues as follows. Next, for each measurement vector, and within the search ranges for that vector, points are searched for along the perimeter of a feature. When a point is not located, a representation indicating no point on the perimeter is found, is produced. When a point is located, measuring a vector dimension at the angle specified for that vector and producing a representation indicating when the dimension exceeds a maximum measurable value. Defects are then reported for vector dimensions that are less than the minimum allowable dimension (or representation thereof) or greater than the maximum allowable dimension (or representation thereof).

In another embodiment, a method for measuring features in a part starts by locating Reference Data and defining tolerance band(s) that specify how much one or more features can spatially deviate from the Reference Data. Measurement vectors are created at fixed spatial locations around a perimeter of each feature, with each measurement vector representing a dimension of the feature in the Reference Data from a point on the perimeter to another point on the perimeter at a specified angle. A linear search range around each fixed spatial location is also defined, to enable finding of starting and ending points for each measurement vector. Each linear search range has a search axis oriented in a same angular orientation as its corresponding measurement vector.

Next, for each feature to be inspected, the feature is moved to a plurality of positions within the feature's tolerance band. For each such position of the feature, and at each previously created spatially fixed measurement location, points are searched for, along the perimeter of the feature within the specified search range. When a point is found on the perimeter, a vector dimension is measured, at the angle specified by the corresponding measurement vector. The resulting dimension is stored as being allowable. When a vector measurement exceeds a maximum measurable value or when no points are found on the perimeter this result is also stored as being allowable. For each spatially fixed measurement location, allowable minimum and maximum vector dimensions are stored, corresponding to the plurality of positions of the feature within its tolerance band.

Measurement vectors whose dimension does not change, or only changes within a defined minimal critical dimensional tolerance, as each feature is moved within its corresponding tolerance band, are stored as Critical Dimension Vectors.

The process for measuring a part from a scanned image then continues, for each Critical Dimension Vector, by locating, within the search ranges for that vector, points along the perimeter of the feature. At each such perimeter point located, a vector dimension is measured at the same angle as its corresponding measurement vector Statistical data is then computed from the vector dimension measurements, as a function of feature type, with said statistical data computed over the entire part, or for sections of a part, or for different die on a part or sections within different die on the part, with a given feature type being represented by features of the same dimensions in the Reference Data. Statistical data may be computed for a feature type being at least one of a minimum, a maximum, an average, and a standard deviation, statistical value. Finally, the statistical data is reported for use in characterizing the part or for process control.

BRIEF DESCRIPTION OF THE DRAWINGS

The description below refers to the accompanying drawings, of which:

FIGS. 2A through 2E illustrate the limitations of pattern matching used by prior art inspection systems;

FIG. 3A through 3D show how gray scale camera pixels are classified as conductor or insulator;

FIG. 5 is an illustration with vectors showing the width of conductors and space between conductors measured along the entire length of the conductors;

FIG. 6 is an illustration showing that measurements are not affected by motion within the tolerance bands;

FIG. 7A shows vector measurements computed from Reference Data;

FIG. 7B is a table listing measurements generated from reference data;

FIG. 8 shows search ranges to find edges in a scanned image;

FIG. 9 is an illustration in which the reference image is shifted to the right horizontally and down vertically;

FIG. 10A is an illustration showing feature edges found in a shifted reference;

FIG. 10B is a table listing measurements generated from a shifted reference;

FIG. 11A shows boundary boxes around each vector indicating region of uncertainty and shows range of valid vector values;

FIG. 11B is a table with an Inspection Parameter List of conductor edge locations, measurement angles, and allowable vector lengths;

FIG. 12A is the illustration of a scanned image containing a narrow line defect and a wide line defect;

FIG. 12B shows an Inspection Parameter List and results of inspection;

FIG. 14A is an illustration showing how measurements are performed over the entire perimeter of a feature with measurement spacing as close as one pixel;

FIG. 14B is a table showing an Inspection Parameter List computed for the feature in FIG. 14A;

FIG. 15A is an illustration showing that uncertainty in scanned image placement does not affect or compromise the ability to defect protrusions, nicks and defects smaller than the uncertainty region;

FIG. 15B is a table showing the Inspection Parameter List used to inspect the feature in FIG. 15A and the results of the inspection;

FIG. 15C is a table showing an inspection parameter list with manufacturing tolerances added to inspect the feature in FIG. 15D and results of the inspection;

FIG. 15D is an illustration showing a feature containing defects plus a protrusion and nick within manufacturing tolerances;

FIG. 16A is an illustration showing reference data for an insulator between two conductors;

FIG. 16B is a table showing the Inspection Parameter List of measurement insulator edge locations, measurement angles, and allowable vector lengths for FIG. 16A;

FIG. 17A is an illustration of a scanned image of an insulator between two conductors;

FIG. 17B is an Inspection Parameter List used to inspect feature in FIG. 16A and results of inspection;

FIGS. 18A through 18E show signals and images used to find edges of conductors and insulators to sub-pixel accuracy;

FIG. 20A show a method for conversion of CAD data to reference gray scale pixels;

FIG. 20B is a plot of reference pixel intensity versus reference pixel position across a sample line;

FIG. 21A is a scanned camera image of a target 2;

FIG. 21B is the gray scale converted CAD data for target 2 convolved with a camera lens blur function;

FIG. 21C is a table listing the linewidth difference measured between CAD data convolved with lens blur function (FIG. 21B) and scanned camera image (FIG. 21A);

FIG. 22A is the scanned fluorescent image of metal conductors, which appear black, on a bright fluorescing substrate;

FIG. 22B shows linewidth violations detected in the fluorescent image of FIG. 22A;

FIG. 22C shows space violations detected in the fluorescent image of FIG. 22A;

FIG. 23 is an illustration showing an extra metal defect in reference data;

FIG. 27A is an illustration with a boundary box around each vector indicating region of uncertainty and showing range of vector values;

FIG. 27B is a Measurement Parameter List for feature shown in FIG. 27A indicating critical width vectors;

FIG. 28A is an illustration of a scanned image of a part showing feature edges found and computed critical width vectors;

FIG. 28B is a table listing critical width vector measurements computed from feature in scanned image of FIG. 28A;

FIG. 28C is a table listing statistical data computed from critical width vector measurements for the feature in FIG. 28A;

FIG. 29 is an illustration of a scanned image compared to reference data and with measurement vectors extending to opposite sides of the feature;

FIG. 33 is an illustration of a scanned image of a defective pad superimposed on expected edge pixel locations with search ranges;

FIG. 34 is an illustration of a scanned image of a defective pad with edge pixels located within search range FIG. 35 is an illustration of a Feature Shape Processor;

DETAILED DESCRIPTION OF ILLUSTRATIVE EMBODIMENT(S)

Figure 1A:
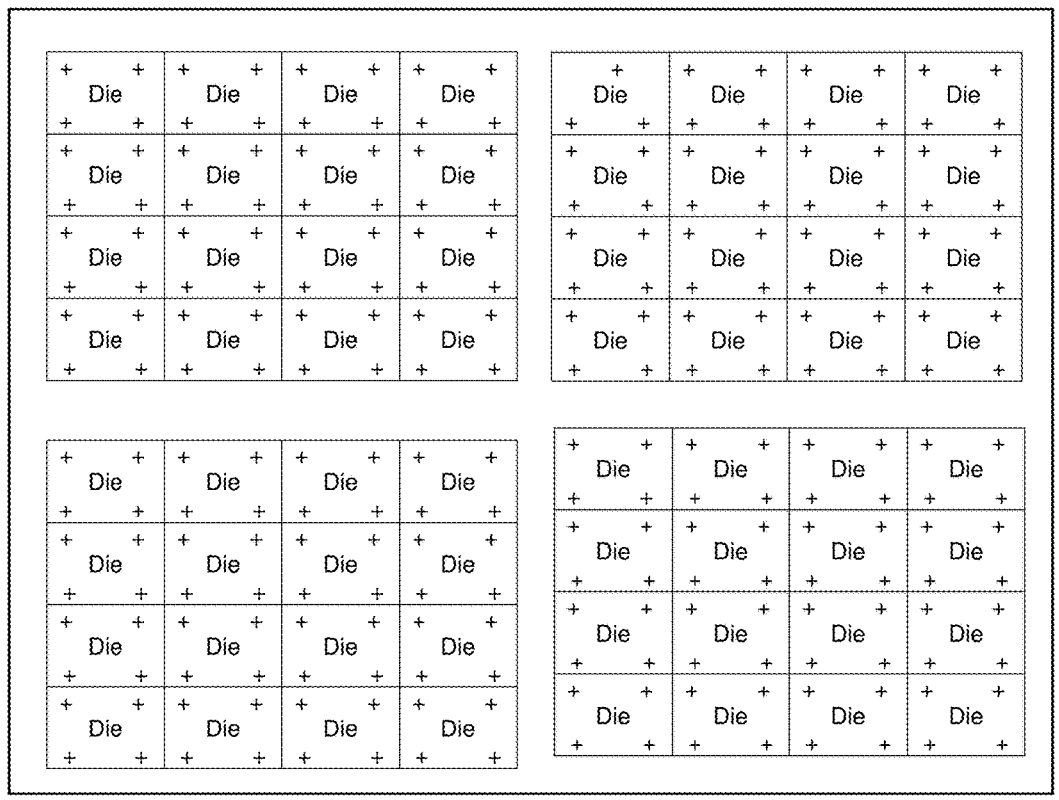
FIG. 1A is an illustration of wafer of a circuit board substrate with numerous die.
Figure 1B:
FIG. 1B is an illustration of a Reference Image of a Conductor.
Figure 1C:
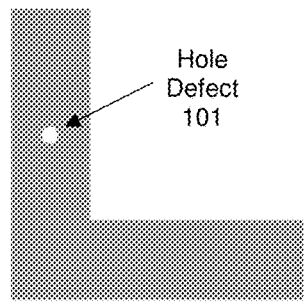
FIG. 1C is an illustration of a Scanned Camera Image of a Conductor.
Figure 1D:
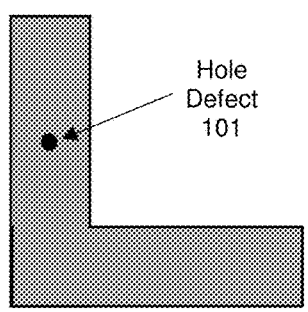
FIG. 1D is an illustration of a perfect superposition of a scanned camera image over a reference image showing a defect.
Figure 4:
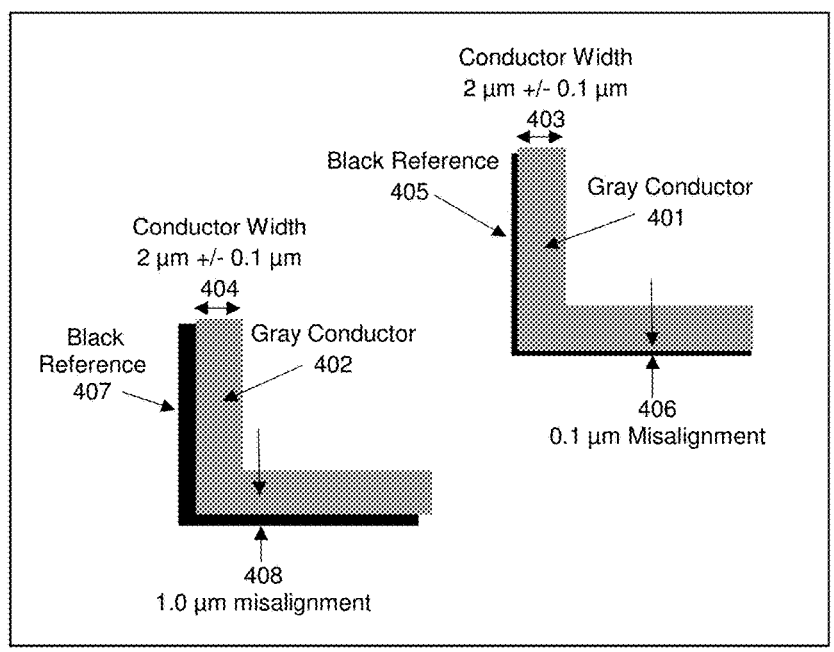
FIG. 4 shows a scanned image subsection compared to CAD data.

As mentioned above, this patent relates to improved inspection of precision parts such as wafers, high-density circuit boards, multi-layer substrates, inner-layer substrates, chrome on glass masks, and other fine line products. The approach performs billions of two-dimensional conductor width, and space metrology measurements, to within sub-camera-pixel, sub-micron accuracy, as the part is scanned in real time at production speeds.

With this approach, the accuracy of the sub camera pixel, sub-micron width and space metrology measurements is not limited by the placement accuracy of the conductors. As a result, variations in conductor placement in the scanned image of a part, due either to limitations in the manufacturing process or limitations in the inspection scanning process, do not limit or degrade the accuracy of the conductor width or space measurements.

The billions of metrology measurements can be performed to said sub-camera-pixel, sub-micron accuracy at every pixel location along the entire length or perimeter of every conductor on the part with all computations performed in real time. Our new approach to verify correct conductor width and spacing requirements to sub-micron accuracies does so without requiring fine alignment comparison of a scanned image to a stored reference pattern.

Briefly, to inspect a part, the method or apparatus first searches a scanned image to locate each feature and once located, then measures each feature's size and computes feature size statistics. Metrology measurements and detection of defects may be performed simultaneously in real time as the part is scanned. Examples of different feature types are lines and pads of different widths and diameters such as, for example, 2 μm lines, 5 μm lines, 20 μm diameter pads, 50 μm diameter pads, etc.

Due to the billions of measurements that typically must be performed over the entire part, a self-learning automated method or apparatus extracts measurement values from computer aided design (CAD) files or Reference Data, including a way to define allowed manufacturing tolerances.

Furthermore, statistical data can be computed, such as, but not limited to, minimum, maximum, average, and standard deviation for feature size, line width and space measurements computed for an entire part, sections of a part, for each die on a part, or for sections of each die, and for up to one hundred percent of the features on a part. In addition to generating statistics based on billions of locations on a part, as the part is scanned in real time, optimal locations can be determined for performing the measurements used to calculate the statistical data. Such automatic setup is advantageous for factories with a large volume of different parts.

More particularly, conductor width is measured along the entire length of every conductor line in a die, and the space between conductors, for all die on the part in real time as the substrate is scanned at production speeds. Such conductor width and space measurements are performed to sub-camera pixel, sub-micron accuracy. As a part is scanned, this approach first searches to locate each feature, and then once located measures its size. Measurements may be performed for every feature on the part. Thus billions of computations, measuring line widths, spaces and critical dimensions, may all be performed in real time as the part is scanned.

More particularly, FIG. 5 is an example where the gray colored arrows in the black conductors represent linewidth measurements and the black colored arrows in the white regions between the conductors represent line space measurements. Gray colored bidirectional arrow 501 is an example of one linewidth measurement and black colored bidirectional arrow 502 is an example of one line space measurement.

Both linewidth and space measurements are performed along the entire length of each conductor and for every conductor in the circuit. Furthermore, measurements are preferably computed at every pixel location along the entire length or perimeter of each conductor. These measurements are then compared to a list of expected or correct measurement values previously computed from CAD data or from the scan of a known good part. Furthermore, such measurements are performed to sub-pixel, sub-micron accuracy without being compromised by variation in feature placement on the part.

For example, FIG. 6 illustrates how conductors 601 and 602 can independently vary in spatial position within specified tolerance bands 603, indicated by the dashed lines surrounding each conductor, and still be measured to sub-pixel, sub-micron accuracy—as indicated by the double sided arrow vector lines within and between the black conductors. All vectors extend from one edge of a conductor to the other edge of a conductor bypassing the tolerance bands. Vector 604 is an example of a vector used for measuring conductor linewidth and vector 605 is an example of a vector used for measuring conductor spacing.

FIGS. 7A through 11 should now be referenced in conjunction with the steps described below which explain how a list of acceptable width measurement values are generated from Reference Data and then used to inspect a part.

a. Either CAD data or a scan of a golden known good part is identified and serves as a Reference Data 701 for what is considered to be a perfect part, as shown in FIG. 7A.

b. From the Reference Data 701, edge (boundary) pixels are located along the entire perimeter of each feature for all features, or for at least a subset of features, in the Reference Data. In FIG. 7A, points 1A, 1B, 2A, 2B, 3A, 3B, 4A, 4B, and 5A, 5B are examples of edge pixels.

The width of each feature is measured along the perimeter of each feature, recording the set of starting and ending edge pixel locations used to compute the width and angle of each measurement. This measurement may typically be taken perpendicular to the respective edge pixels, or at some other predetermined angle. Other ways to represent this measurement are possible. Examples of such measurements with their corresponding angles are represented by vectors $V_1$ through $V_5$ in FIG. 7A and in the Table 7, FIG. 7B.

In the example Reference Data for FIG. 7A, and as shown in Table 7 FIG. 7B, point $1_A$ is a starting vector location, point $1_B$ is an ending vector location, the angle of vector measurement is zero (0) degrees relative to the horizontal, and $R_1$ equals the length, or distance, of measured vector $V_1$. As a second example, point $3_A$ is a starting vector location, point $3_B$ is an ending vector location, the angle of vector measurement is forty-five (45) degrees relative to the horizontal, and $R_3$ equals the length, or distance, of measured vector $V_3$. As a third example, point $4_A$ is a starting vector location, point $4_B$ is an ending vector location, the angle of vector measurement is ninety (90) degrees relative to the horizontal and $R_4$ equals the length, or distance, of measured vector $V_4$.

c. A next step is to define an uncertainty or tolerance band around the features in the Reference Data indicating the maximum offset or spatial deviation allowed, at the time of inspection, between the Reference Data and Scanned Image. Such a tolerance band 702 is indicated by the dashed boundary lines in FIG. 7A.

d. For each starting and ending pixel location in the Reference Data, a "linear search range" is then defined that will be used at the time of inspection to search for an edge in the scanned image. Each linear search range is oriented along the same angle of measurement as the vector defined by the starting and ending pixel location in the Reference Data. Search ranges are illustrated by the solid lines with bidirectional arrows in FIG. 8. As an example, the linear search range around pixel location 5b is Sr. Each linear search range should extend past or at least to the edge of the tolerance band, indicated by the dashed lines in FIG. 8, to ensure that an edge is found in the scanned image as the conductors move within the region of uncertainty or tolerance band, at the time of inspection.

e. To simulate how vector length measurements will be affected by such scanned image placement uncertainty at the time of inspection, Reference Data is moved within the tolerance band to simulate such motion, and the resulting vector length measurements are stored for each position of the Reference Data.

As an example, FIG. 9 shows the Reference Data shifted half a grid box down and half a grid box to the right relative to the nominal Reference Data position shown in FIG. 7A. To simulate the measurement process that will be performed on a scanned image during inspection of a real part, edges 1A,1B through 5A,5B are searched for, within each pixel's surrounding linear search range, as indicated by the solid lines with bidirectional arrows in FIG. 9. As an example, Sr 902 in FIG. 9 indicates the linear search range around edge pixel 5B. Once the edges of the shifted Reference are found through this linear search, the length of each vector is measured at the locations indicated by the circles (o) in FIG. 10A. As an example, circle (o) 1001 corresponds to the edge pixel found at location 2BF. Table 10 in FIG. 10B lists the location of each resulting edge pixel found in the example of FIG. 10A, with a corresponding angle of measurement, and the length of the measured vector.

As illustrated in FIG. 10A and Table 10, pattern motion in the direction along the axis of vector measurement does not affect the measured length of the vector. Furthermore, motion out of the axis of measurement in regions of constant feature width also does not affect the reported length of the vector. As an example, vectors $V_2$, $V_3$, and $V_4$ in FIGS. 10A and 11A lie in regions of constant feature width because the values of these vectors do not change as the Reference Data is shifted within the tolerance band. These constant width regions are graphically illustrated by the solid rectangles 1102, 1103 and 1104 in FIG. 11A drawn around vectors $V_2$, $V_3$, and $V_4$.

As shown in Table 10, FIG. 10B, the values of vectors $V_2$, $V_3$, and $V_4$ are thus not affected by such pattern movement and agree with the values listed in Table 7, FIG. 7B, measured before the Reference Data was shifted. However, vectors $V_1$ and $V_5$ in regions of rapid feature width transition are affected when the Reference Data is shifted. For example, vector 1 reduces in length from $R_1$, in the Table 7 of FIG. 7B, to zero, in Table 10 of FIG. 10B, because edges $1_A$ and $1_B$, at the very end of the feature are not found when the Reference Data is shifted, as shown in FIG. 10A. Likewise, vector $V_5$ increases in width from $R_5$ (in Table 10 of FIG. 7B) to $R_5+D$ (in Table 10 of FIG. 10B) because this vector is also in a region of changing feature width.

The rectangles surrounding vectors $V_1$ through $V_4$, and the quadrangle surrounding vector $V_5$ in FIG. 11A, represented by arrows 1101, 1102, 1103, 1104 and 1105 respectively, graphically indicate the range of measurement values for each vector that would be measured as the Reference Data moves around within the tolerance band. Table 11 in FIG. 11B is an example of an inspection list used to inspection a part from a scanned image. The list contains, for each vector, the expected conductor edge starting location, expected conductor edge ending location, angle of vector measurement, length of linear search range, minimum allowable vector length and maximum allowable vector length.

Thereafter, the process continues as follows:

f. To create the list of valid width measurement ranges for each vector prior to inspection, Reference Data is "moved" within the tolerance band to simulate motion of the scanned image during inspection (as per FIGS. 9, 10A, 11A). Vector lengths are measured for each position of the Reference Data, by searching for and locating the edges of a feature within each specified linear search range, and then measuring the length between the edges, for example, a measurement taken perpendicular to the direction of the edge (FIG. 9, 10A, 11).

g. The same edge finding and measurement procedure is used on the Reference Data image to generate an Inspection List as will be subsequently used on the scanned image to measure vector lengths at the time of inspection. The Inspection Parameter List is then created containing all the vectors to be measured (FIG. 11B). For each such vector measured, an entry in the Inspection Parameter List contains the vector's expected starting edge position, expected ending edge position, angle of measurement, length of linear search region, minimum allowable vector length and maximum allowable vector length.

It should be noted that given the starting edge position, angle of measurement, minimum vector length and maximum vector length are included in the Inspection Parameter List, inclusion of the ending edge position in this list is optional since it provides redundant information.

h. Once the Inspection Parameter List has been created, it is used during the inspection process to measure the linewidth of all critical features and detect defects, as described using FIGS. 12A and 12B.

As an example, FIG. 12A shows a scanned feature with a reduced line width (nick) defect 1202 (vector $V_3$) and a wide line protrusion defect 1203 (Vector $V_4$), with both defects falling within the allowed tolerance band. These types of defects (wide line protrusion and narrow line nick) were not detectable using prior art inspection techniques when they fell within the tolerance band, as shown in FIG. 2E.

More particularly, in our improved approach, during inspection of the scanned image, feature edges are searched for within linear search ranges Sr (see FIG. 8) around each starting pixel location $1_A$ through $5_A$ listed in Table 12 of FIG. 12B. Somewhere within the specified search ranges conductor edges are found at actual locations $2_{AF}$ through $5_{AF}$, as indicated in FIG. 12A. For each edge found, feature width is measured perpendicular to actual starting edges $2_{AF}$ through $5_{AF}$ with vector measurements $V_2$ through $V_5$ ending at opposite edges $2_{BF}$ through $5_{BF}$ respectively. Actual starting and ending edge locations found in the scanned image are labeled with circles (o) at the beginning and end of vectors $V_2$ through $V_5$, as shown in FIG. 12A. As an example, circle (o) 1204 corresponds to the edge pixel found at location 2BF.

i. Note, edges corresponding to locations $1_A$ and $1_B$ in Table 12 FIG. 12B are not found in the shifted down scanned image of FIG. 12A, so vector $V_1$ in Table 12 has a measured value of zero ($V_1$=0). Thus, in a next step, vector lengths $V_1$ through $V_5$, generated during inspection, are compared to corresponding minimum and maximum allowable values created prior to inspection. As an example, measured vector length V1 equals zero (V1=0) is compared to the minimum allowable vector length of zero (0) and the maximum allowable vector length of R1, listed in Table 12 of FIG. 12B. Since the vector length of zero (V1=0) measured during inspection of the scanned part is within the listed allowable range, no defect is reported. However, when vector $V_3$ measuring (R3−D1) is compared to a minimum allowable value of R3, listed in Table 12, a narrow conductor defect measuring (R3−D1) is reported in the classification column of Table 12, FIG. 12B, because (R3−D1)<R3. Likewise, when vector V4 measuring R4+D2, during inspection of the part, is compared to the maximum allowable length of R4, listed in Table 12, a wide conductor defect measuring (R4+D2) in length is reported, as indicated in the classification column of Table 12.

Figure 13:
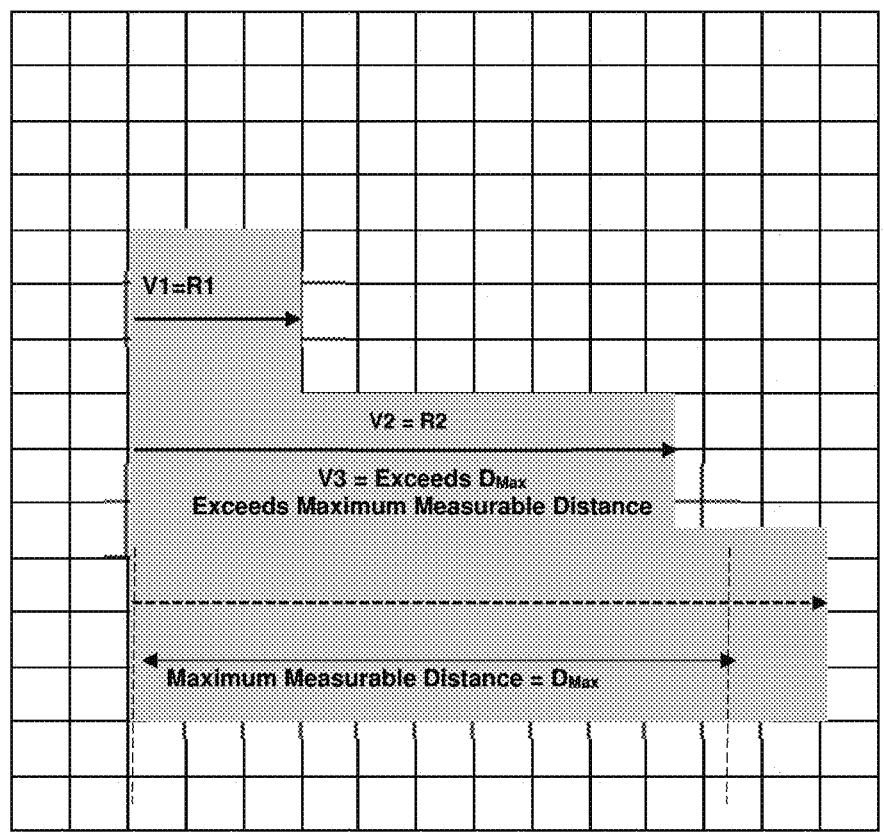
FIG. 13 is an illustration of vector measurements that exceed the maximum measurable distance.

To implement such an inspection system, one must realize that there could always exist some feature whose width can exceed the maximum measurable distance capability of the inspection system. This is indicated by vector V3 in FIG. 13 that exceeds the maximum measurable distance ($D_{MAX}$), indicated by bidirectional arrow 1301. When this occurs a vector length measurement of $D_{MAX}$, or an equivalent indicator thereof, is entered into the Inspection list for the allowable vector length.

The vector measurement procedures described by FIGS. 7 through 13 can be performed at every location on a part to ensure that all defects are detected, since the location of defects are unknown prior to inspection. This is another major difference over prior art systems which only perform sample measurements at predetermined locations on the part.

As an example, FIG. 14 shows a preferred implementation of the algorithm in which every pixel location along the edge of each feature in the Reference Data is measured to create the Inspection Parameter List of Table 14, shown in FIG. 14B. The example list shown in Table 14 includes, for every vector measured: its starting conductor edge position, ending conductor edge position, angle of measurement, search range length, minimum allowable vector length, and maximum allowable vector length.

For example, in Table 14, vector H1 has an expected starting conductor edge position of x=4, y=11, an expected ending conductor edge position of x=6, y=11, a measurement angle of zero (0) degrees relative to the horizontal, a linear search range to hunt for an edge in the scanned image of +/−½ unit of measure around the starting and ending expected conductor edge positions, a minimum allowable measured vector length of 0, and a maximum allowable vector length of W1.

The Inspection Parameter List of Table 14, FIG. 14B, created from Reference Data, is then used to inspect a scanned part, find defects, and measure conductor linewidth along the entire length of the features in the part, as shown in FIG. 15A.

The high density of spatial measurements, shown in FIG. 15A, provides redundancy to greatly improve detection of defects. For example, the pinhole defect at the intersection of vectors H2 and V2 in FIG. 15A is found by both vectors H2 and V2. Vector H2 measuring ½ W1, in the "Measured Vector Length" column of the Table 15-1, FIG. 15B, is less than the allowed minimum value of W1 and vector V2 measuring L1−D2 is less than the minimum allowable value of L1.

The feature width (nick) reduction at the intersection of vectors H5 and V6 illustrates why such redundancy is required. While vector H5, measuring L2−D3 in Table 15−1 of FIG. 15B, certainly intersects this defect, this measurement does not fall below the allowable minimum vector length value of W1, listed in Table 15-1 of FIG. 15B, which can occur if the scanned image were to be shifted down to the lowest position indicated by the tolerance band shown in FIG. 14A. As a result, vector length H5 equal to L2−D3 does not flag this defect. However, due to redundancy, vector V6 measuring W2−D5 (in FIG. 15A and Table 15-1, FIG. 15B) during inspection, is less than the minimum allowable vector length of W2, so this defect is detected by vector V6 and is reported as a Reduced Linewidth Defect of width W2−D5, as indicated in Table 15-1, FIG. 15B.

Another example of why such redundancy is beneficial is further demonstrated by the reduced linewidth (nick) defect at the intersection of vectors H6 and V10.

While vector V10, measuring W2-D6 in FIG. 15A and in Table 15-1, FIG. 15B, certainly intersects this defect, this measurement does not fall below the allowable minimum vector length value of zero (0), listed in Table 15-1. This can occur if the scanned image were to be shifted to the farthest left position indicated by the tolerance band shown in FIG. 14A. As a result, vector V10 equal to W2-D6 does not flag this defect. However, due to redundancy, vector H6 measuring L2−D4 (in FIG. 15A and Table 15-1, FIG. 15B) during inspection, is less than the minimum allowable vector length of L2, so this defect is detected by vector H6 and is reported as a Reduced Linewidth Defect of width L2−D4, as indicated in Table 15-1, FIG. 15B, in the Measured Vector Length column.

In another example, the wide line protrusion defect at the end of vector V1 in FIG. 15A is now found because even with a minimum allowable length of zero (0) and a maximum allowable length of L1, as listed in Table 15-1, FIG. 15B, the measured length of V1 equal to L1+D1, exceeds the listed maximum allowable length of L1.

In production applications there is typically some conductor size tolerance allowed relative to the dimensions specified in the CAD or Reference Data to allow for variations in the manufacturing process. Such manufacturing variances can be entered into the Inspection List. As an example, the feature shown in FIG. 14A with corresponding inspection list Table 14, provided in FIG. 14B, contains two conductor widths, W1 and W2, and two conductor lengths, L1 and L2. If the allowable manufacturing variance for the width of a conductor is +/−a and for the length of a conductor is +/−β, the Inspection List of Table 14 can be modified to include these allowable production variances as illustrated in Table 15-2, FIG. 15C. The modifications are entered into columns entitled "Min. Vector Length" and "Max Vector Length", of Table 15-2. Using the variance-modified parameters to inspect the feature shown in FIG. 15D yields the results provided in Table 15-2, FIG. 15C in the columns entitled "Information Below Generated During Inspection of FIG. 15D". Referring to Table 15-2, Vector V1 measures (L1+D0) due to a small protrusion of length D0 at the top left corner of the feature. Given D0<β, then (L1+D0)<(L1+β) (see Table 15-2), so this manufacturing anomaly, now within manufacturing fvariance, is not flagged as a defect. Likewise, vector V6 measures (W2-D8) due to a small nick of depth D8 near the arrowhead of this vector. Given D8<α, then (W2−α)<(W2−D8)<(W2+α), so this other manufacturing anomaly is also not flagged as a defect in Table 15-2. However, real defects such as the pinhole at the intersection of vectors H2 and V2 and the large nick at the arrow end of vector H6 are flagged as defects, as indicated in Table 15-2.

In addition to finding defects by measuring the width of features in the part, it is also possible to simultaneously measure the space between features as illustrated in FIGS. 5, 6, 16 and 17. In FIGS. 5 and 6 the black bidirectional arrows in the white regions represent vector space measurements between the features shown as black conductors.

FIGS. 16A through 18E are now used to explain how these space measurement vectors are generated and spaces measured during an inspection process.

j. Let Reference Data 1601 in FIG. 16A represent a section of insulator, shown in white, surrounded by conducting metal, shown in gray. Let the dashed boundary lines surrounding the insulator represent the tolerance band 1602 or uncertainty of positional placement of the scanned image relative to the Reference Data during inspection.

k. To inspect the insulator, a Inspection Parameter List is created from the Reference Data prior to inspection, using the identical procedure previously described to create the inspection list for the conductors but now using the insulator as the feature of interest.

As an example, FIG. 16A is the Reference Data for a part containing two conductors, shown in gray, separated by an insulator, shown in white. To create the Inspection Parameter List for inspection of the insulator, vector width measurements are performed at every pixel edge location along the entire length of the insulator, as shown in FIG. 16A. To simulate misalignment of the scanned image relative to the Reference Data that may occur during inspection, vector width measurements are performed for every possible position of the Reference Data within the tolerance band 1602 indicated in FIG. 16A, using the same procedure previously described for conductors. For every vector measurement, the Inspection Parameter List includes: the vectors starting edge position, ending edge position, angle of measurement, length of search range, minimum allowable vector length, and maximum allowable vector length.

As illustrated in Table 16, FIG. 16B, vector H1 has an expected insulator starting edge position of x=6, y=15, an expected insulator ending edge position of x=8, y=15, a measurement angle of zero (0) degrees relative to the horizontal, a linear search range to hunt for an edge in the scanned image of +/−½ unit of measure around the starting and ending expected edge positions, a minimum allowable measured vector length of W3, and a maximum allowable vector length of W3. As another example, vector H11, in Table 16, has an expected starting edge position of x=6, y=6, and an expected ending edge position equal to "$D_{MAX}$" to indicate that no end to the insulator was found in the Reference Data within the maximum possible measurable vector distance, when searching at an angle of zero (0) degrees from the starting edge at location x=6, y=6. However, if the image were to shift down one pixel location within the tolerance band, H10 would measure W3. Therefore, the minimum allowable length for vector H10 in Table 16 is set equal to W3 and the maximum allowable value is set equal to $D_{MAX}$ to indicate that no edge or end to the insulator could be found, or exists, within a measurable range in the Reference Data for this spatial position of the scanned image.

The Inspection Parameter List is used in a next step, to inspect a scanned part. Referring to FIGS. 17A and 17B, during this inspection step, vector length measurements from the scanned part are compared to the list of previously generated expected values. As an example, the left side of Table 17 contains the expected vector length values from Table 16 generated from Reference Data 1601 in FIG. 16A and the right side contains the vector lengths measured from a scanned image 1701, shown in FIG. 17A, obtained during inspection of the part.

During this inspection step, the high density of spatial measurements performed, shown in FIG. 17A, provides redundancy to greatly improve detection of defects in the insulator. As a first example, the extra conductor defect 1702 in FIG. 17A is found by both vectors H11 and V9. Vector H11 measuring L1, in the "Measured Vector Length" column of Table 17, is less than the allowed minimum value of $D_{MAX}$ and vector V9 measuring W4-S1 is less than the minimum allowable value of W4.

As a second example of how such redundancy increases the detection of defects, consider the reduction in the width of the insulator at the intersection of vectors H10 and V7 in FIG. 17a. While vector H10, measuring (W3+P2) in Table 17 certainly intersects this defect, this measurement does not fall below the allowable minimum vector length value of W3, listed in Table 17, which can occur if the scanned image were to be shifted down to the lowest position indicated by the tolerance band shown in FIG. 16A. As a result, vector length H10 equal to W3+P2 does not flag this defect. However, due to redundancy, vector V7 measuring W4−P1 (in FIG. 17a and Table 17) during inspection, is less than the minimum allowable vector length of W4, so this defect is detected by vector V7 and is reported as a Narrow Insulator Defect of width W4−P1, as indicated in Table 17.

In a third example, the wide insulator defect at the end of vector H6 in FIG. 17a is found because the measured length of H6 equal to W3+N1, exceeds the listed maximum allowable width of W3.

The accuracy of conductor linewidth measurement is proportional to the precision to which conductor edge positions can be measured. While the precise position of each edge is known very precisely when extracted from CAD data, camera quantization introduces positional uncertainty when such edge positions are extracted from scanned imagery, as previously explained and illustrated in FIGS. 3A to 3D. Such pixel quantization can introduce up to one camera pixel of error in the measured length of a vector.

To achieve finer vector measurement accuracy and measure vector length in the scanned image to sub-pixel, sub-micron resolution, an additional two-step process may be performed.
l. First, the grayscale camera signal is passed through a two-dimensional Edge Filter to identify regions of edge transition.
m. Then, a polynomial curve is fitted to the output of the Edge Filter to identify the precise position of the edge, which typically exists somewhere between camera pixels.

This two-step process is explained in detail with the aid of FIGS. 18A through 18E. FIG. 18A is the actual scanned fluorescent image of a thin flexible circuit panel with metallic conductors on an organic insulator. In FIG. 18A, the non-fluorescing metal conductors appear black and the fluorescing insulators appear bright. FIGS. 18A and 18B both show scan line 1801 intersecting a metallic conductor with a starting edge position X and ending edge position Y, as indicated in both Figures. Scan line 1801 extends from camera pixel A to camera pixel B, as indicated in FIGS. 18A, 18B, and 18C.

FIG. 18B shows the output image of a two-dimensional Edge Filter operating on the image of FIG. 18A. The output of the edge filter at the left edge of the conductor trace, intersecting horizontal scan 1801 at position "x" in FIG. 18B, is dark indicating this is a transition from bright insulator to dark conductor. The output of the filter at the right edge of this conductor, along scan line 1801 at position "y" appears bright indicating that this is a transition from dark conductor to bright insulator. The output of the two-dimensional Edge Filter also indicates the orientation of each edge.

FIG. 18C is a plot of both the camera pixel intensity 1802 across scan line 1801 in FIG. 18A and the corresponding output signal from the Edge Filter 1803. Each camera pixel intensity value is indicated by a black dot on solid black curve 1802, which has a corresponding Edge Filter output value indicated by a gray dot on solid gray curve 1803.

The approximate positions of left and right edges x and y, in FIGS. 18A and 18B, correspond to the spatial positions of the most positive and most negative data points, respectively, in the Edge Filter output curve 1803 shown in FIG. 18C. Since the output of the camera and Edge Filter only provide intensity values at 3o discrete spatial pixel locations, indicated by the black and gray dots in FIG. 18C, the actual conductor edge positions could easily exist anywhere between these discrete locations.

To estimate edge positions to sub-camera pixel accuracy second order polynomials (parabolas) 1804 and 1805 are fit to the Edge Filter output data in the region surrounding the most negative and most positive peaks of the Edge Filter output data, respectively. Derivatives are then computed for best fit polynomials 1804 and 1805 and precise edge positions are defined as the coordinates where the slope or derivatives of the polynomials (parabolas) equal zero (0).

As an example, in FIG. 18C, two best fit parabolas 1804 and 1805, drawn as black dashed lines, are independently fit to the surrounding Edge Filter data points corresponding to edges x and y in FIGS. 18B and 18C. FIGS. 18D and 18E are zoomed in expanded views around the peaks of best fit parabolas 1804 and 1805, shown in FIG. 18C. In both FIGS. 18D and 18E, the conductor edge is defined as the point where the derivative of the best fit polynomial is zero, thereby corresponding to its peak value.

As an example, FIG. 18D shows Edge Filter output values corresponding to camera pixel locations 20 and 21 with the negative peak of the best fit parabola occurring between these discrete values at camera pixel position x=21.53474 pixels. Likewise, FIG. 18E shows Edge Filter output values corresponding to camera pixel locations 33 and 34 with the positive peak of the best fit parabola occurring between these discrete values at camera pixel position x=33.6488 pixels.

The images and data shown in FIGS. 18B through 18D were generated using a Sobel type Edge Filter, known to the industry, and the two best fit polynomials to the Edge Filter output data were generated using second order parabolic polynomials. There are numerous two-dimensional Edge Filters known to the industry such as, for example, Sobel, Canney and Prewitt. These filters and other such similar edge filters can also be incorporated for this application. Furthermore, while second order parabolic polynomials were used to best fit the Edge Filter output data in this example, higher order polynomials can also be substituted for this application.

Figures 19A, 19B:
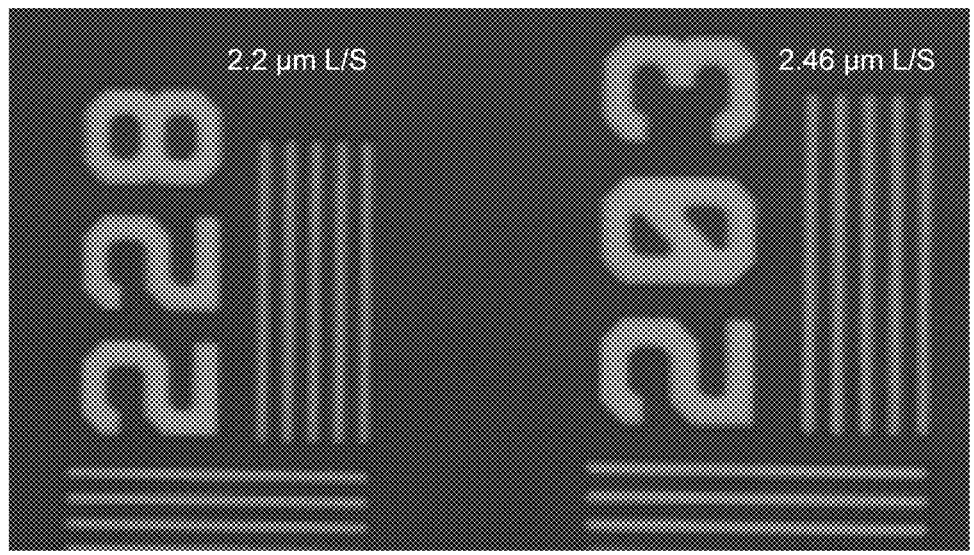
FIG. 19A is the scanned chrome on glass gray scale image of test target 1.
FIG. 19B is a table showing the results of measuring linewidths on test target 1 using a Sobel Gradient Algorithm.

FIG. 19A is the scanned image of a chrome on glass calibration target (Target 1) showing two test patterns. One test pattern contains 203 lines/mm and the other contains 228 lines/mm. The 203 lines/mm pattern has a line and space width equal to 2.46 μm and the 246 lines/mm pattern has a line and space width equal to 2.20 μm. When the two test patterns were measured using a Sobel Edge Filter and edge positions estimated as the peaks of the best fit parabolic curves, where the derivatives are zero (0), the measured line widths for both patterns were correct to within +/−0.035 um of the known correct value, as indicated in Table 19, FIG. 19B.

n. To enable inspection and verification of correct measurement values, vector lengths measured in the scanned image must agree, within specified tolerances, with the vector lengths generated from the Reference data prior to inspection. There are at least three ways of generating the measurement vectors in the Inspection Parameter List (examples shown in Table 14 of FIG. 14B and Table 15-2 of FIG. 15C) from the Reference data: Scan a known good perfect "Golden Part" to generate a Reference Image. From this scanned gray scale Reference Image use the Edge Filter—best fit polynomial procedure described in connection with FIGS. 18A-18D to compute the required measurement vectors to sub-pixel accuracy.

If the Reference Image was generated from CAD data, the format of the data may already be in a vector format that allows direct computation of these vector lengths to sub camera pixel accuracy. If so, convert the CAD data to a Gray Scale Reference Image, to simulate the output of an inspection camera, as explained with the aid of FIG. 20A. Then calculate the measurement vectors from this Gray Scale Reference Image using the Edge Filter—best fit polynomial procedure described in FIG. 18A-18D.

In one preferred method to convert CAD data to a Gray Scale Reference image, intensity values for each pixel of the Gray Scale Reference Image are computed as follows:
  i. Create a grid of reference pixels, each reference pixel equal in size to that of a camera pixel, as illustrated by the example 6×8 grid pointed to by arrow 2001 in FIG. 20A.
  ii. Superimpose the Reference Grid 2001 over CAD data of equal or higher resolution such that each reference pixel is typically composed of or contains multiple CAD data points, as shown in FIG. 20A. In the example of FIG. 20A, each reference pixel contains 25 CAD data points, where a single CAD data point is pointed to by arrow 2002.
  iii. The gray scale intensity value (Ref Pix Intensity) for each reference pixel in FIG. 20A, is given by:

$$Ref\ Pix\ Intensity = \frac{area\ of\ Reference\ Pixel\ containing\ CAD\ conductor\ data}{total\ area\ of\ Reference\ Pixel}$$

As an example, each large square of the 6×8 grid 2001 in FIG. 20A represents the size of a reference pixel which is equal in size to a camera pixel. The small squares, within each large square, represent the resolution of the CAD data. In this example each reference pixel contains 25 CAD data points. The gray scale intensity value is also listed in each reference pixel and is equal to the area of the reference pixel covered by conductor divided by the total area of the reference pixel. In other words, the numerical value written in each reference pixel, in FIG. 20A represents the gray scale intensity value for that pixel. FIG. 20B indicates the gray scale intensity values for the eight reference pixels along a scan line 2003 drawn in FIG. 20A.

Each of the measurement vectors in the Inspection Parameter List are then calculated from the intensity values in the gray scale reference image using the Edge Filter—best fit polynomial curve procedure as was described in connection with FIGS. 18A-18D above.

Another method to achieve an even closer match between the vector measurements calculated from the scanned camera image, and those in the inspection list, is to first convolve the gray scale reference Image with the Blur Function of the camera imaging lens so that the resulting reference data better simulates the real output of the inspection camera and then use the Edge Filter—best fit polynomial operations on this convolved image to compute the inspection list of measurement vectors.

As an example, FIG. 21A is the scanned camera image of a calibration test target referred to as Target 2, which containing 1.95 µm and 2.19 µm lines/spaces, as indicated in this figure. FIG. 21B shows the results of convolving the gray scale converted CAD data for Target 2 with the Blur Function of the camera lens used to image Target 2 onto the camera. Notice how well the convolved reference image of FIG. 21B agrees with the actual scanned camera image of FIG. 21A. Intensity waveforms 2102 and 2104 for scan lines 2101 and 2103 respectively are provided in FIGS. 21A and 21B showing how closely the convolved reference intensity waveform and scanned camera intensity waveform agrees.

Vector length measurements are then calculated from the convolved reference image of FIG. 21B to create the Inspection List of measurement vectors needed to inspect the scanned camera image of FIG. 21A. The known line/space widths from the CAD data of Target 2 and the difference between the vector lengths computed from the convolved reference image of FIG. 21B and from the scanned camera image of FIG. 21A are provided for comparison in Table 21 of FIG. 21C.

To perform a meaningful inspection of an electronic part, the inspection system must provide some way for the manufacturer to specify acceptable tolerances. There are two types of tolerance parameters associated with the inspection technique described herein:
  Tolerances to specify the search range to look for the edge of a feature in the scanned camera image, as indicated by arrow Sr in FIG. 8, and
  Tolerances to specify the range of acceptable lengths for each vector measurement, found in the scanned image, as indicated by the tolerance values α and β in Table 15 of FIG. 15C.

As illustrated in Table 15-2, different tolerance values can be set for different types of features. For example, for 2 µm lines/spaces an acceptable vector length measurement tolerance may be set to +/−0.2 µm and the search range (Sr) set equal to +/−1.0 µm, whereas for 10 µm lines/spaces the measurement length tolerance may be set equal to +/−1.0 µm and the search range set equal to +/−3 µm.

FIGS. 22A, 22B, and 22C are examples taken from an actual inspection of a thin flexible fluorescing organic substrate showing the results of inspecting a section thereof with 2 µm lines/spaces in which the search range (Sr) was set to 2.1 µm and the measured vector length tolerance set equal to 0.2 µm. FIG. 22A is the scanned image of the thin flexible fluorescing organic substrate in which the metal conductors are black, and the fluorescing substrate is bright. FIG. 22B shows conductor linewidth violations and FIG. 22C shows spacing violations. Locations where the lines and spaces deviate more than the specified vector length tolerance (0.2 µm) but less than twice this tolerance (0.4 µm) are marked with the numeral 1. Locations where the lines and spaces deviate more than twice the specified vector length tolerance (>0.4 µm) but are found within the specified search range (2.1 µm) are marked with the numeral 2. Locations where the lines and spaces are not found within the specified search range (Sr=2.1 µm) are marked with the numeral 3.

FIGS. 22A, 22B and 22C clearly illustrate how defects that violate the parameters of an Inspection Parameter List are detected using the techniques described herein. However, defects in the form of extra metal (conductor) in the middle of a large area of insulator, as shown by arrow 2301 in FIG. 23 or extra insulator (a hole) in the middle of a large area of metal, are not detected because the Reference Data has no features in this area, therefore, no measurement vectors are created in the Inspection Parameter List, to check these areas.

To enable defects in the form of such extra features in the scanned image to be detected, scanned data is also compared to an image of the Reference Data. However, such comparison can be performed without requiring fine alignment of the scanned and reference images. As an example, consider the extra metal defects 2401 in the scanned image of FIG. 24, and extra metal defects 2501 in the scanned image of FIG. 25.

Such detects can be detected, at the time of inspection, by searching the Reference Data for any metal within a neighborhood surrounding the same coordinates in the Reference Data as the coordinates of the extra metal feature found in the scanned image. For example, since no metal exists in the Reference Data within the limits of the search area defined by the dashed rectangle 2402 in FIGS. 24, and 2502 in FIG. 25, the extra metal features in the scanned images are detected and classified as defects. However, if such extra features in the scanned image are close to features in the Reference Data (e.g., less than distance Dmax away as defined in FIG. 13), such as defect 2503 in FIG. 25, then this extra metal defect 2503 is detected as a space violation because vector 2505 is shorter than Dmax.

Figure 26:
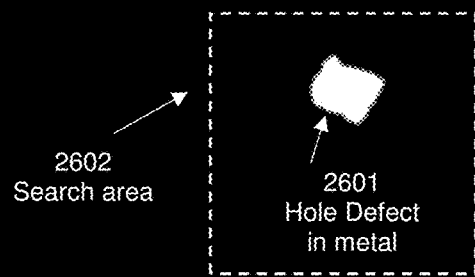
FIG. 26 is an illustration showing a hole defect in a large area of metal.

Defects in the scanned image in the form of holes exposing insulator in large areas of metal, such as hole 2601 in FIG. 26, are detected in a similar fashion by searching the Reference data within a search area 2602, at the time of inspection, for insulating material surrounding the same coordinates in the Reference Data as the coordinates of the hole in the scanned image. If no hole is found in the Reference Data within the search region 2602, the hole in the scanned image of FIG. 26 is classified as a defect.

Figure 24:
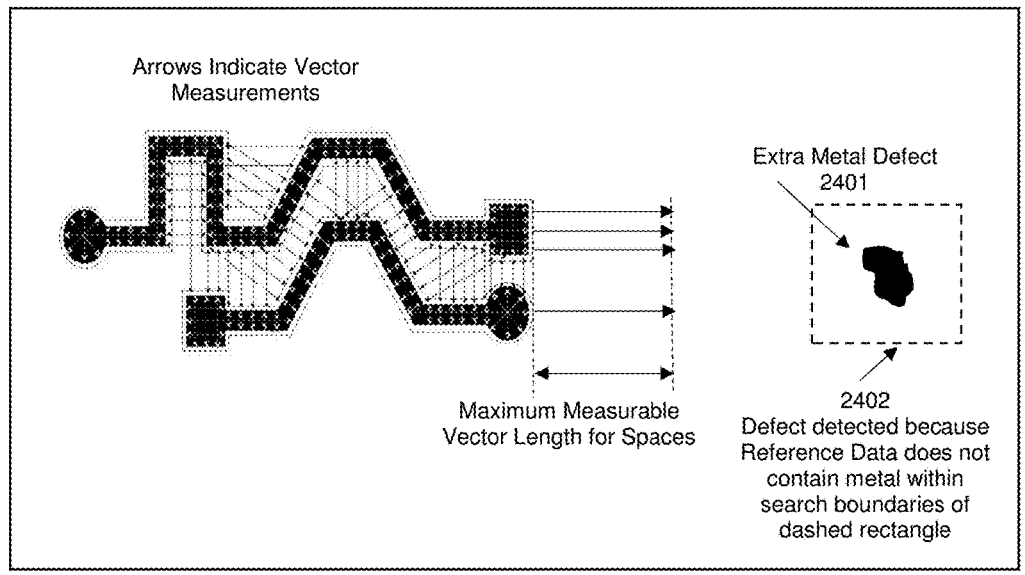
FIG. 24 is an illustration showing an extra metal defect in a large area of insulator.
Figure 25:
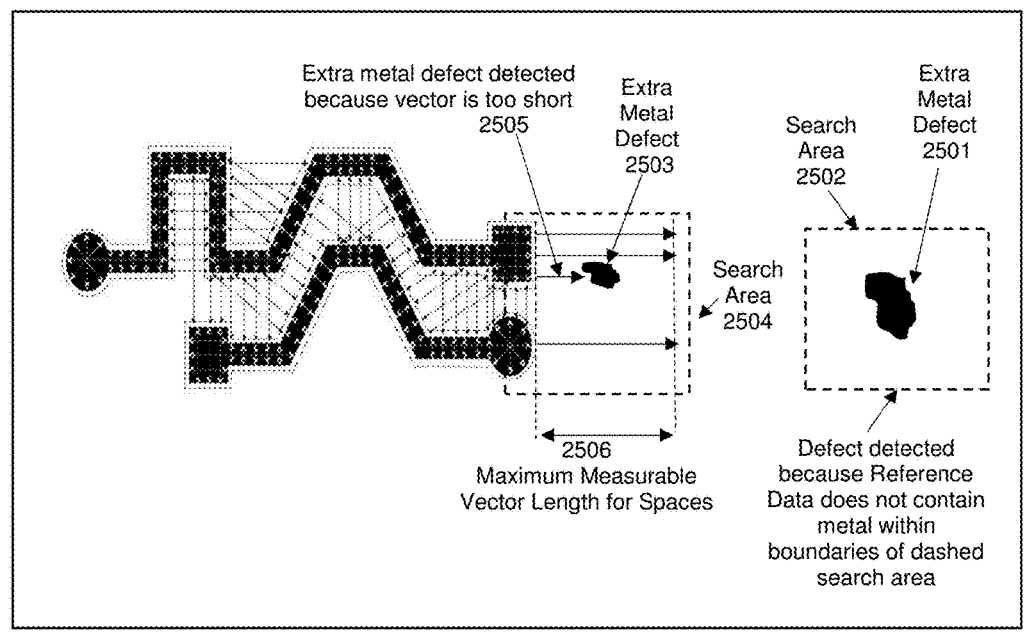
FIG. 25 is an illustration showing multiple extra metal defects.

While FIGS. 23, 24, and 25 graphically illustrate the presence of conductors (black) on an insulating substrate (white), the approaches described herein are applicable for any part in which conductors can be distinguished from insulators. For example, FIGS. 22A, 22B, 22C show metal conductors, which appear black, on a fluorescing substrate, which appears bright. FIG. 19A shows chrome conductors, which appear bright, on a glass insulating substrate, which appears dark. Other examples are brightly fluorescing resist patterns on metal, and bright reflective metallic conductors on non or minimally reflective substrates.

As long as the conductors can be distinguished from the insulators in the scanned camera image, the method described herein to inspect a part is applicable.

Another application is to perform automated metrology measurements on electronic parts such as, but not limited to, wafers, circuit boards, substrates, inner-layers, and masks, to obtain statistical data such as, but not limited to, minimum, maximum, average, and standard deviation feature size, line width and space measurements computed for an entire part, sections of a part, for each die on a part, or for sections of each die, and for up to one hundred percent of the features on a part. In addition to generating statistics based on billions of locations on a part, as the part is scanned in real time, the approach described herein also automatically determines optimal locations for performing the measurements used to calculate the statistical data. Such automatic setup is essential for factories with a large volume of different parts.

To explain how such automatic setup may be performed, consider the feature 2701 in the Reference Data shown in FIG. 27A and the Measurement Parameter List, Table 27, in FIG. 27B. Table 27 lists the conductor measurement edge locations, vector measurement angles, and the minimum and maximum allowable vector lengths generated as Reference Data with feature 2701 is moved within the region of uncertainty defined by tolerance band 2702 shown in FIG. 27A. To perform accurate metrology measurements, calculating accurate feature width as the part is scanned, the system is preferably designed to ensure that the reported vector measurements are not adversely affected, or incorrectly reported, due to inaccuracies in the system, caused by for example, but not limited to, vibrations in the stage, non-linearities in the stage and limitations in stage repeatability.

Locations on the part automatically selected to measure data for computing statistics are referred to as Critical Width Vector locations. They correspond to those vectors, called Critical Width Vectors, that do not change magnitude or only change within a small defined minimal critical width tolerance as the feature is moved within its tolerance band. For example, a feature may be moved+/−1 μm in different directions within its tolerance band but the critical width tolerance for the width of a conductor may be set to 0.2 μm for the conductor's vector to qualify as a Critical Width Vector. As an example, in Table 27, vectors V2, V3, V4 and V5 remain constant as the Reference Data moves within the tolerance band—and therefore these vectors can be used to measure critical width. On the other hand, vectors V1 and V6 do not qualify as valid vectors for measuring critical width because vector V1, ranging between 0 and R1, and vector V6, ranging between R6−D and R6+D, change magnitude as the Reference Data moves within the tolerance band.

Since vectors V1 and V6 can change value as the part is scanned due to system uncertainties, they are not used to calculate statistics.

Table 27 in FIG. 27B lists examples of such vectors and indicates which are Critical Width Vectors that can be used to compute statistical measurements.

FIG. 28A represents a scanned camera image in which conductor edges for Critical Width Vectors are found at locations 2AF, 2BF, 3AF, 3BF, 4AF, 4BF, and 5AF, 5BF. These locations are graphically indicated by circles (o) in FIG. 28A. Such Critical Width Vectors, found in the scanned image, are marked with the letters "CW" in front of the vector name. Refer, for example, to vectors $V2=CW-V_2$, $V3=CW-V_3$, $V4=CW-V_4$, and $V5=CW-V_5$.

To compute statistical data for the scanned part, all features of the same design size in the Reference Data may be grouped together, such as lines of the same size, spaces of the same size, and pads of the same size. As an example, all Critical Width Vectors whose minimum and maximum allowable magnitude is W1 (see FIGS. 27A and 27B) may be grouped together to compute statistical data for feature size or line width W1. Likewise, all critical width vectors whose minimum and maximum allowable magnitude is W2 may be grouped together to compute statistical data for feature size or line width W2, etc.

This grouping results in billions of critical width measurements being performed as the part is scanned in real time. Using all the information provided in the Inspection Parameter List, including which vectors constitute Critical Width Vectors, as indicated in the last column of Table 27, FIG. 27B, enables simultaneous computation of critical width statistics based on billions of sub-micron resolution measurements, while simultaneously finding defects on the part also measured to sub-micron resolution.

Table 28-2 in FIG. 28C is an example of statistics computed for the feature 2801 in FIG. 28A. Table 28-2 shows the resulting minimum, average, maximum, and standard deviation values for conductors W1 and W2 calculated from Critical Width Vectors measured over the entire feature. In general, such statistics can be computed for an entire part, sections of a part, for each die on a part, or for sections of each die, and for up to one hundred percent of the features on a part.

At the time of inspection, when a part is scanned, there are two preferred methods for computing vector length from the scanned image. The two methods are defined as follows: Vector Length Method 1 defines the length of the measured vector from the scanned image as the length between one of the edges, found in the specified search range, and the next change in material along the axis of vector measurement. As an example, in FIG. 15A, vector H2, computed at the time of inspection, extends from one edge of the feature to the pin hole (represented by a change in material) located in the center of the feature.

Vector Length Method 2 defines the length of the measured vector from the scanned image as the square root of the sum of the squares of the two edge pixel locations found at opposite sides of the feature, along the axis of vector measurement, within the specified search ranges. As an example, the length of vector $CW-V_{2F}$ in FIG. 28A and in Table 28 (FIG. 28B), is given by:

$$CW-V_{2F} = \sqrt{(2AF_x - 2BF_x)^2 + (2AF_y - 2BF_y)^2}$$

where one edge of the feature is located at pixel location $(2AF_x, 2AF_y)$ and the other edge of the feature is located at pixel location $(2BF_x, 2BF_y)$.

Vector Length Method 1 has the advantage that defects in the middle of the feature will be detected but requires that all the pixels along the length of the vector need to be analyzed. In comparison, Method 2 is computationally less involved because only the edge pixel locations are processed to compute vector length across the entire width of the feature, but Vector Length Method 2 alone will not detect defects in the middle of the feature, such as a pinhole. However, if the inspection system incorporates Method 2 to measure feature width, in combination with comparing the scanned image to Reference Data to find extra and missing features (as illustrated in FIGS. 24, 25, and 26), then the pinhole could be detected as an extra insulator defect in the middle of the line given the pattern match search area (as also illustrated in FIGS. 24, 25, and 26) is reduced to fall within the boundaries of the feature as indicated by pattern match search area 2901 in FIG. 29 at the intersection of vectors H2 and V2.

When the purpose of the inspection is to find all defects and simultaneously collect statistical linewidth and line space data; then for those products when the line/space size of the conductors is on the order of the inaccuracies in the system, Vector Length Method 1, which can detect defects in the middle of a conductor is preferable because it may not be possible to create a pattern match search area that remains within the boundaries of the conductor, as shown in FIG. 29. However, if the line/space width is sufficiently large to ensure placement of the pattern match search area within a conductor line, then Vector Length Method 2 is applicable. Furthermore, in those applications in which only statistical line width/space data is of interest Vector Length Method 2 is also applicable.

While linear measurements are the preferred means for characterizing conductor lines and spaces, circular and elliptical measurements are more suitable for characterizing vias and pads. When Reference Data is generated from CAD data, features such as via's and pads are frequently either provided on separate design file layers or uniquely identified within the CAD file data. This information allows the inspection system to know where on the part such features will be located so Feature Shape Processors can be used to analyze such features.

Figure 30:
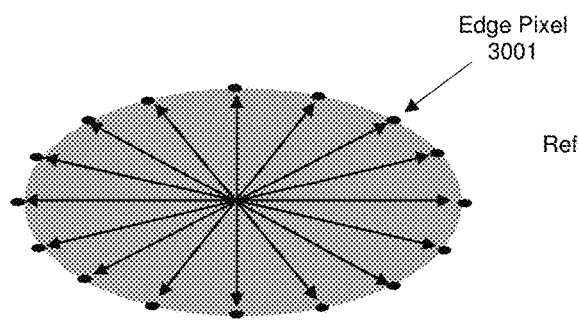
FIG. 30 is an illustration of reference data showing elliptical pad edge pixels and vectors.

For example, FIG. 30 shows the edge pixels of an elliptically shaped pad generated from Reference Data provided in CAD Gerber format. Arrow 3001 points to one of the edge pixels. For each edge pixel on the ellipse in the Reference Data, vectors are created, typically perpendicular to the edge, pointing to and extending to the opposite edge of the ellipse, using the identical procedure to generate these vectors as the procedure illustrated in FIGS. 7 and 8 for linear conductors and space features.

Figure 31:
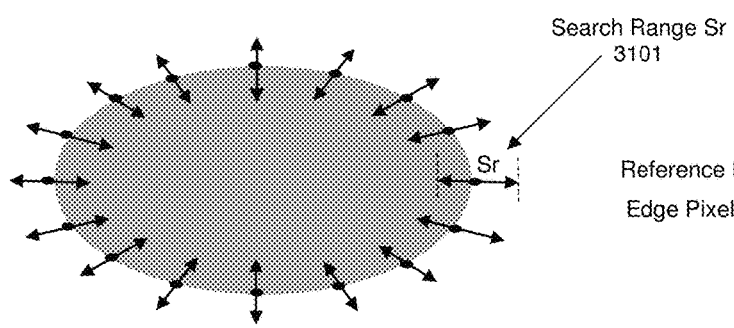
FIG. 31 is an illustration of reference data showing elliptical pad edge pixels and search ranges.
Figure 32:
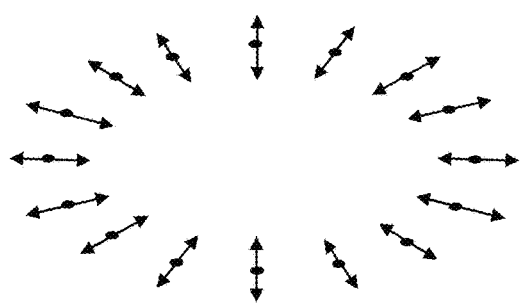
FIG. 32 is an illustration of reference data showing expected edge pixel locations and search ranges to be used to locate ellipse in the scanned data.

For each edge pixel of the ellipse a search range Sr 3101 is defined as illustrated in FIG. 31, using the identical procedure illustrated in FIG. 8 for the linear edge feature. FIG. 32 illustrates where in physical space, at the time of inspection, edge pixels will be looked for in the scanned image. FIG. 33 is the scanned image of a defective pad, with defect 3301 at the edge of the pad. FIG. 33 indicates the search range Sr 3101 in which the system is expecting to find edge pixels in the scanned image. FIG. 34 shows where the edge pixels are found in the scanned image and then presented to a Feature Shape Processor.

FIG. 35 represents a Feature Shape Processor 3501 optimized for analysis of elliptical and circular pads. Note, a circular pad is an ellipse whose major and minor axes are equal. In this example, the Feature Shape Processor 3501 computes the best fit ellipse (BFE) 3502 to the scanned data edge pixels 3503, as shown in FIG. 35. Feature Shape Processor 3501 then computes the standard deviation (STD) between the scanned data pixels 3503 and the BFE 3502, and how much each edge pixel differs from the BFE. If the difference for a scanned edge pixel exceeds a predetermined value an error is reported, as indicated by edge pixel 3504 differing by a distance "D" from BFE 3502 as illustrated in FIG. 35.

Other measurements that can be calculated by the Feature Shape Processor are for example, but not limited to, the major and minor axis, and the center of the ellipse. Statistical data for all ellipses and circles of the same size on the part can be computed such as, but not limited to the STD of the major and minor axis for elliptical pads, and STD from the center for elliptical and circular pads. Furthermore, additional Feature Shape Processors can be added to the system each optimized for analyzing a different shape, for example, one Feature Shape Processor can be optimized for a triangular shaped pad and another optimized for a teardrop shaped pad, etc. In general, Feature Shape Processors can be incorporated when there is a need to perform a feature dependent measurement.

As mentioned previously, in a preferred embodiment, all computations are performed in real time as the part is scanned, with the Feature Shape Processor performing its processing of both pads and vias simultaneously with comparison to Reference Data, and such processing also being performed simultaneously with any length and width measurements of every line and space on the part along the entire length of every feature on the part.

Figure 36:
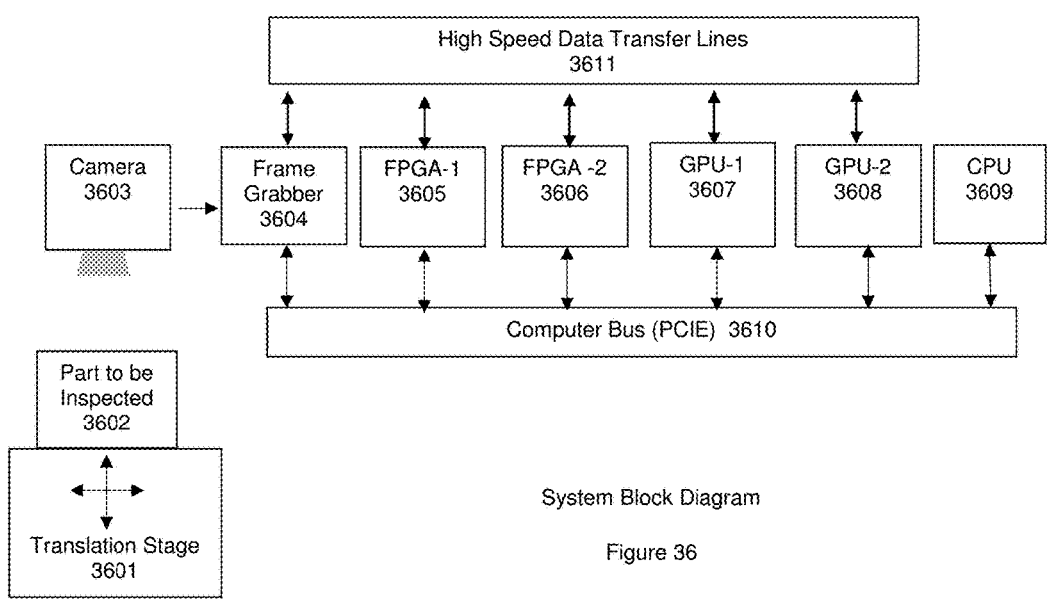
FIG. 36 is a system block diagram.

FIG. 36 is one example of a preferred system block diagram that can provide such real time processing. The system contains a translation stage 3601, that scans part 3602 beneath camera 3603 that in turn transfers the images to frame grabber 3604. Frame grabber 3604 then makes the images available to Field Programmable Gate Array 1 (FPGA 1) 3605 for processing and analysis with optional additional processing and analysis performed by FPGA 2 3606. Processed data from the FPGA's is transferred to Graphic Processing Unit 1 (GPU-1) 3607 and optionally to GPU-2 3608 for further processing and analysis. Data from the FPGA's and GPU's are transferred to CPU 3609 for additional processing and analysis. All FPGA's, GPU's, and the CPU are connected to computer bus 3610.

To achieve the data rates and computational power required to perform billions of measurements in real time as the part is scanned, the following hardware modules may be incorporated in an implementation. Camera 3603 is manufactured by Vieworks model VT-9K7X0H250 and is an 8912 pixel×128 line TDI sensor with a line rate of 250 KHz and a data rate of 2.23 gigapixels/second. (Vieworks is a trademark of Vieworks, Ltd. of Gyeonggi-do, Republic of Korea) Frame Grabber (3604) is implemented on a board manufactured by Gidel model Proc 10A which contains multiple Altera FPGA chips (Gidel is a trademark of Gidel International of Or Akiva, Israel and Altera is a trademark of Altera Corporation of San Jose, Calif.). The frame grabber 3606 is implemented in one of the Altera FPGA chips and FPGA-1 3605 in FIG. 36, is implemented in another chip on the same board. For example, the Gidel Proc 10A, containing multiple Altera FPGA boards, is capable of approximately five (5) terabytes ($5 \times 10^{12}$ bytes) of data per second.

This architecture also supports multiple FPGA's, and multiple Gidel Proc 10A processors, as indicated by FPGA-2, 3606 in FIG. 36. High speed data transfer lines 3611 connect signals between Frame Grabber 3604, FPGA-1 3605, FPGA-2 3606, GPU-1 3607, and GPU-2 3608. GPU-1 3607 and GPU2 3608 are implemented using Nvidia Tesla P100 and or Nvidia Tesla V100 processing accelerator cards. The Nvidia Tesla P100 provides more than 21 teraFLOPS of 16-bit floating-point (FP16) performance" and the NVIDIA Tesla V100 Tensor Core is, at the time of this filing, the most advanced data center GPU ever built to accelerate AI (artificial intelligence), high performance computing (HPC), and graphics. Its powered by NVIDIA's Volta architecture, comes in 16 and 32 GB configurations, and offers the performance of up to 100 CPUs in a single GPU.

It is with this, unimaginable, computational power consisting of; up to 100 CPUs in a single GPU, FPGA's that can process up to approximately five (5) terabytes ($5 \times 10^{12}$ bytes) of data per second, and cameras that scan at data rates of 2.23 gigapixels/second that enables the processes and processors described herein to be implemented in real time.

All high speed hardware modules (camera, FPGA's and GPU's) communicate with general purpose CPU 3609 over the PCIE computer bus 3610. CPU 3609 is implemented with a Xeon Processor, manufactured by Intel, running the Windows 10 operating system manufactured by Microsoft.

It is important to emphasize that even with this extremely high speed processing hardware, pre-processing the Reference Data in advance of the inspection to generate said Inspection Parameter Lists and Measurement Parameter Lists is an essential component which in combination with such high speed hardware enables the billions of metrology measurements to be performed in real time as the part is scanned.

It can now be appreciated that the system architecture shown in FIG. 36 can be used to implement one or more of the inspection and/or measurement techniques described above.

Figure 37:
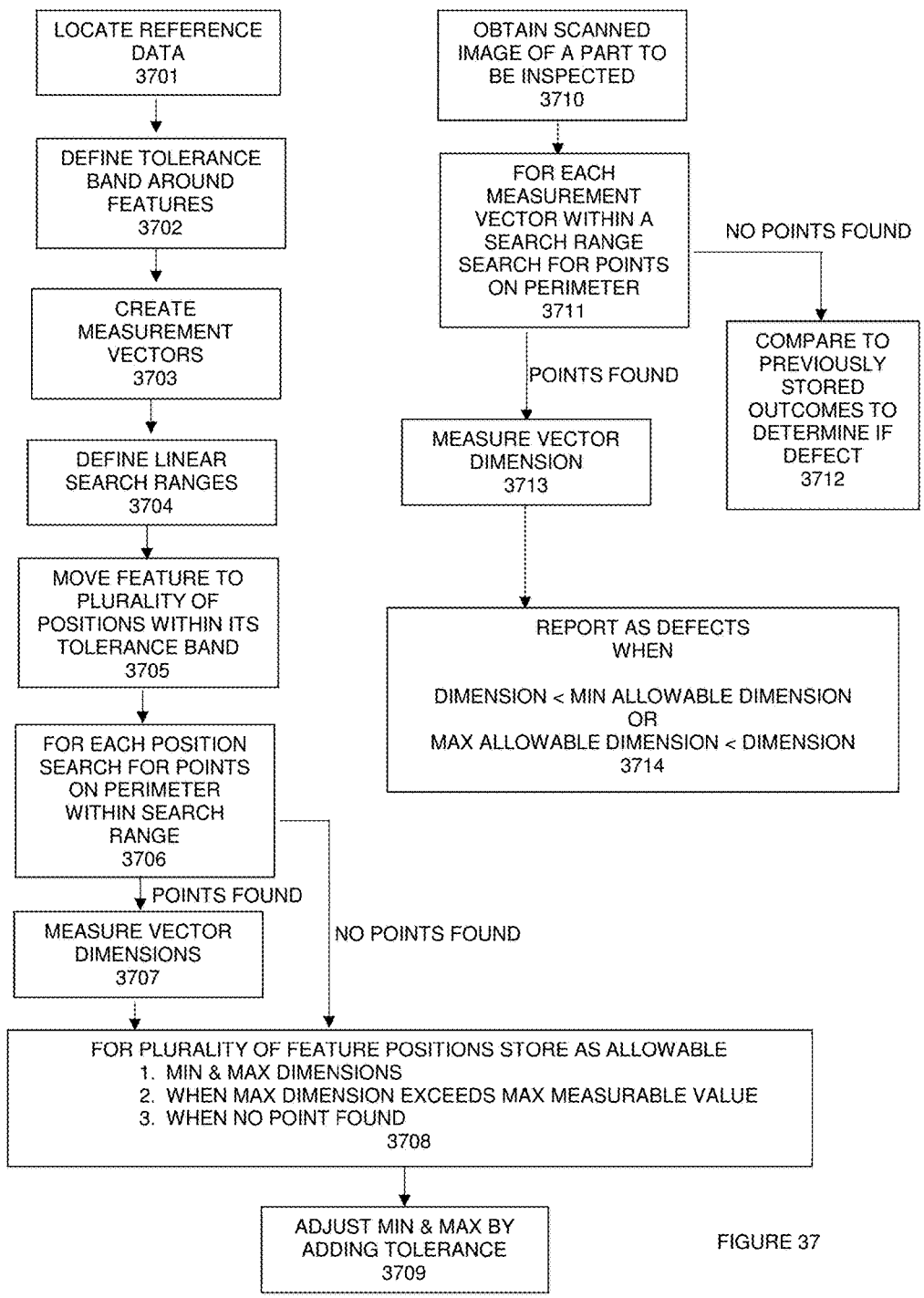
FIG. 37 is a process diagram for an example inspection.

By way of an example, FIG. 37 is an execution flow for a method for inspecting features in a part for defects. A first step (step 3701) locates Reference Data, then tolerance band(s) are created (3702) that specify how much one or more features may spatially deviate from the Reference Data. Measurement vectors are then created (3703) at fixed spatial locations around a perimeter of each feature. Each measurement vector represents a dimension of the feature in the Reference Data from a point on the perimeter to another point on the perimeter at a specified angle. A linear search range is also defined (3704) around each fixed spatial location to enable finding of starting and ending points for each measurement vector. Each linear search range has a search axis oriented in a same angular orientation as its corresponding measurement vector.

Next, for each feature to be inspected, moving (3705) the feature to a plurality of positions within the feature's tolerance band. For each position of the feature, at each previously created spatially fixed measurement location, searching (3706) for points along the perimeter of the feature within the specified search range. When a point is found on the perimeter, a vector dimension is measured (3707), at the angle specified by the corresponding measurement vector. The resulting dimension is stored (3708) as being allowable. When a vector measurement exceeds a maximum measurable value or when no points are found on the perimeter this result is also stored as being allowable (3708). For each spatially fixed measurement location, allowable minimum and maximum vector dimensions are stored (3708) corresponding to the plurality of positions of the feature within its tolerance band. These minimum and maximum vector dimensions, or representations thereof, are then modified (3709) to allow for acceptable process variations during inspection of a part.

The process for inspecting a part from a scanned image (step 3710) then continues, for each measurement vector, within the search ranges for that vector, searching for (3711) a point along the perimeter of a feature. When a point is not located, producing (3711) a representation indicating no point on the perimeter is found. When a point is located, measuring (3713) a vector dimension at the angle specified for that vector and producing (3713) a representation indicating when the dimension exceeds a maximum measurable value. Defects are then reported (3714) for vector dimensions that are less than the minimum allowable dimension or representation thereof or greater than the maximum allowable dimension or representation thereof.

Figure 38:
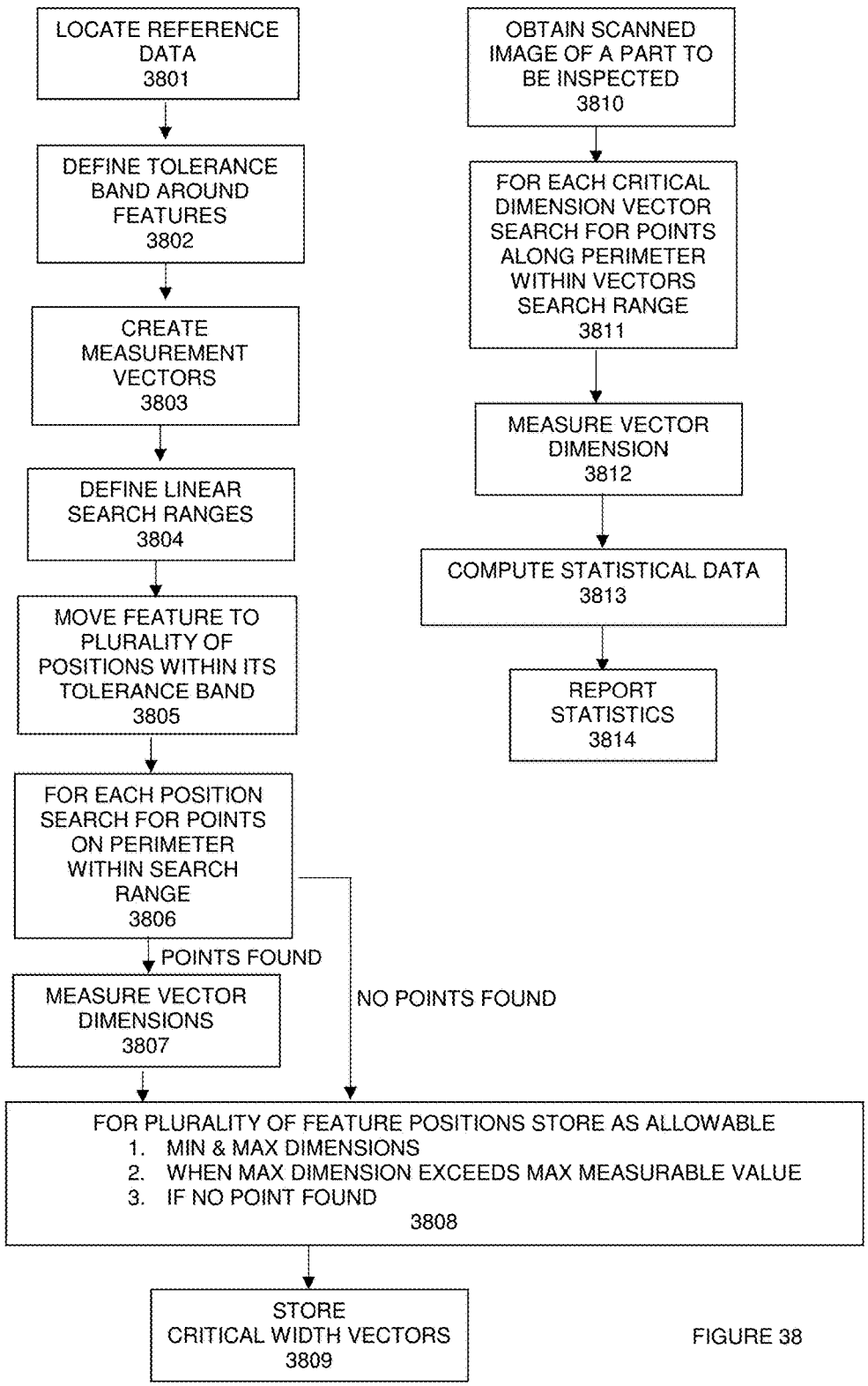
FIG. 38 is a process diagram for an example measurement.

In another example process depicted in FIG. 38, a method for measuring features may be performed. This process also starts (3801) by locating Reference Data, and defining (3802) tolerance band(s) that specify how much one or more features can spatially deviate from the Reference Data. Measurement vectors are created (3803) at fixed spatial locations around a perimeter of each feature, with each measurement vector representing a dimension of the feature in the Reference Data from a point on the perimeter to another point on the perimeter at a specified angle. A linear search range around each fixed spatial location is also defined (3804), to enable finding of starting and ending points for each measurement vector. Each linear search range has a search axis oriented in a same angular orientation as its corresponding measurement vector. For each feature to be measured, the feature is moved (3805) to a plurality of positions within the feature's tolerance band. For each position of the feature, at each previously created spatially fixed measurement location, searching for points (3806) along the perimeter of the feature within the specified search range. When a point is found along the perimeter, a vector dimension is measured (3807) at the angle specified by the corresponding measurement vector, and the vector dimension, or representation indicating when the measurement dimension exceeds a maximum measurable value, is stored (3808) as being allowable. When no point is found along a perimeter, a representation of this result is also stored (3808) as being allowable. Then, storing (3808) for each spatially fixed measurement location, the allowable minimum and maximum vector dimensions, and allowable representations thereof, corresponding to the plurality of positions of the feature within its tolerance band. Those measurement vectors whose dimension does not change, or only changes within a small defined minimal critical dimensional tolerance, as each feature is moved within its corresponding tolerance band, are stored and marked (3809) as Critical Dimension Vectors.

The process for measuring a part from a scanned image (3810) then, for each Critical Dimension Vector (3811), and within the search ranges for that vector (3811), seach for (3811) points along the perimeter of the feature. At each such perimeter point located, a vector dimension is measured (3812) at the same angle as its corresponding measurement vector.

Statistical data (3813) is then computed from the vector dimension measurements, as a function of feature type, with said statistical data computed over the entire part, or for sections of a part, or for different die on a part or sections within different die on the part, with a given feature type being represented by features of the same dimensions in the Reference Data. Statistical data may be computed for a feature type being at least one of a minimum, a maximum, an average, and a standard deviation, statistical value. Finally, the statistical data is reported (3814) for use in characterizing the part or for process control.

CONCLUSION

To summarize, the approach described above performs, on electronic parts such as wafers and high-density circuit boards, billions of two-dimensional conductor width and space metrology measurements, to within sub-camera-pixel, sub-micron accuracy, computing such measurements at every pixel location along the entire length or perimeter of every conductor and feature on the part.

The accuracy of the sub camera pixel, sub-micron line width and space metrology measurements is not limited by the placement accuracy of the conductors on the part, or in the subsection of the part being inspected.

To inspect a part, the approach first searches a scanned image to locate each feature and once located measures its size and computes feature size statistics. Metrology measurements and detection of defects are performed simultaneously in real time as the part is scanned.

Due to the billions of measurements that typically must be performed over the entire part, a self-learning automated method to extract measurement values from computer aided design (CAD) files or Reference Data accommodates allowed manufacturing tolerances.

Furthermore, this technique can compute statistical data such as, but not limited to, minimum, maximum, average, and standard deviation feature size, line width and space measurements computed for an entire part, sections of a part, for each die on a part, or for sections of each die, and for up to one hundred percent of the features on a part. In addition to generating statistics based on billions of locations on a part, as the part is scanned in real time, the approach also automatically determines optimal locations for performing the measurements used to calculate the statistical data. Such automatic setup is preferred for factories with a large volume of different parts.

The foregoing description of example embodiments illustrates and describes systems and methods for implementing an inspection and metrology tool, but is not intended to be exhaustive or to limited to the precise form disclosed.

Certain portions may be implemented as "logic" that performs one or more functions. This logic may include hardware, such as hardwired logic, an application-specific integrated circuit, a field programmable gate array, a graphical processing unit, or may also include in whole or in part, a processor that executes software instructions. Some or all of the logic may therefore be stored in one or more tangible non-transitory computer-readable storage media and may include computer-executable instructions that may be executed by a computer, a data processing system, application specific integrated circuit, programmable gate array or any other state machine. The computer-executable instructions may include instructions that implement one or more embodiments described herein.

It also should be understood that the block and process flow diagrams may include more or fewer elements, be arranged differently, or be represented differently. For example, while a series of steps has been described above with respect to the flow diagrams, the order of the steps may be modified to achieve the same result. In addition, the steps, operations, and steps may be performed by additional or other hardware or software modules or entities, which may be combined or separated to form other modules or entities. For example, while a series of steps has been described with regard to certain Figures, the order of the steps may be modified in other consistent implementations. Further, non-dependent steps may be performed in parallel. Further, disclosed implementations may not be limited to any specific combination of hardware or software.

It will thus now be apparent that other variations and modifications may be made to the described embodiments, with the attainment of some or all of their advantages. Therefore, it is the object of the appended claims to cover all such variations and modifications as come within the true spirit and scope of the disclosure herein and their equivalents.

What is claimed is:

1. A method for inspecting features in a part for defects, the method comprising:
   a. generating Reference Data, by using either Computer Aided Design (CAD) data or by combining scans of one or multiple known good parts, the Reference Data used for generating parameters for inspecting parts,
   b. creating one or more tolerance bands in the Reference Data, around each of one or more features to be inspected, such that when parts of acceptable tolerance are scanned for inspection, each scanned feature falls within a tolerance band defined by the corresponding tolerance bands in the Reference Data,
   c. locating edge pixels, in the Reference Data, along a perimeter of each feature,
   d. for each edge pixel thus located, creating a measurement vector that originates from the edge pixel and points toward an opposite side of the feature, the vector oriented perpendicular to or at a predetermined angle with respect to the perimeter thereby also indicating edge orientation and whose vector length is the distance to the edge pixel on the opposite side of the feature,
   e. storing information representative of a vector length, vector orientation, starting edge pixel, and ending edge pixel coordinates for each measurement vector, the stored information defining measurement locations to be used to locate feature edges when the part is subsequently inspected, f. defining a linear search range to be used to locate each starting and ending edge pixel for each measurement vector when the part is subsequently inspected,
   i. with each linear search range having a search axis oriented in a same angular orientation as its corresponding measurement vector,
   ii. limits of search in one direction along the search axis extending away from each edge pixel with a limit in that one direction extending to or beyond a boundary defined by a closest tolerance band to that edge pixel, and
   iii. a limit in the other direction along the search axis, for that same edge pixel, being equal to or greater than a closest distance between the edge pixel lying along the measurement axis on the other side of the feature and its closest tolerance band,
g. storing corresponding search ranges for each expected starting edge pixel and ending edge pixel location,
h. moving each feature in the Reference Data to all positions within its tolerance band, and
i. for each position of the feature at each previously stored starting and ending pixel measurement location, searching for edge pixels of the feature within the specified search range, and
   i. when an edge pixel is found on the feature,
      A. computing a length of a measurement vector, as a length from that edge pixel found to the edge pixel on the opposite side of the feature, said length determined at the previously stored measurement angle, and
      B. storing as an allowable outcome the computed length of a measurement vector associated with each measurement location, and
      C. when a length of a measurement vector exceeds a maximum measurable value, storing a representation of this result as an allowable outcome,
   ii. when an edge pixel is not found on the feature, storing a representation of this result as an allowable outcome,
j. storing for each spatially fixed measurement location, a minimum and maximum allowable vector dimension, and allowable representations thereof, corresponding to the plurality of positions of the feature within its tolerance band,
k. creating an Inspection Parameter List of stored parameters to be used for inspecting features on a part defined by the reference data, said list containing for each measurement vector, information representative of:
   i. an allowable minimum and maximum vector length, or representations of vector length indicating when the measurement length exceeds a maximum measurable value, or that no edge pixel was found,
   ii. vector orientation,
   iii. search range, and
   iv. starting edge pixel location and ending edge pixel location,
l. modifying each minimum and maximum allowable vector length in the Inspection Parameter List to allow for acceptable process variations during inspection of the part,
m. inspecting the part from a scanned image by, for each measurement location in the Inspection Parameter List,
   i. searching for edges of a feature within the search ranges around the expected starting edge pixel and ending edge pixel locations specified in the Inspection Parameter List,
      A. when an edge is found in the scanned image, performing a vector measurement at the measurement angle specified in the Inspection Parameter List,
      B. when the length of the measurement vector exceeds a maximum measurable value, storing a representation of this result,
      C. when an edge pixel is not found in the scanned image, storing a representation of this result,
   ii. comparing a length of vector measurement to the allowable minimum and maximum length values, or allowable representations thereof, specified in the Inspection Parameter List, and
   iii. reporting as a defect, vector lengths that are less than the allowable minimum length or a representation thereof or greater than the allowable maximum length or a representation thereof in the Inspection Parameter List.

2. The method of claim 1 further comprising:
computing edge pixel locations to sub-pixel accuracy using an edge finding filter, such as, but not limited to a Sobel or Prewitt type filter.

3. The method of claim 1 additionally comprising:
comparing the scanned image of the part to a reference image to find defects.

4. The method of claim 1 additionally comprising:
a. converting the CAD data to a grayscale image, and
b. convolving or processing the grayscale image through a two-dimensional filter to simulate blurring of imaging optics to make the Reference Data better match the scanned image.

5. The method of claim 1 in which the part contains conductors and insulators that can be distinguished from each other in a scanned camera image.

6. The method of claim 1 additionally comprising:
a. during inspecting of a part from a scanned image, for a plurality of measurement locations corresponding to the locations of features in the Reference Data, where a feature dependent measurement is to be computed,
   i. searching for edge pixels of said feature in the scanned image, within the search ranges around the expected edge pixel locations specified in the Reference Data,
   ii. presenting to a Feature Shape Processor for analysis, locations of edge pixels found associated with each feature, and then
b. using the Feature Shape Processor for further
   i. measuring one or more feature dimensions, and measuring at least one of, a distance of found edge pixels to a predetermined expected shape, or a widest dimension, a narrowest dimension, or a center of the feature, and
   ii. reporting as a defect measured feature dimensions that exceed predetermined values.

7. A method for performing automated metrology measurements on electronic parts to obtain statistical data such as, but not limited to, minimum, maximum, average, and standard deviation feature size, line width and space measurements computed for an entire part, sections of a part, each die on a part, or sections of each die on a part, the method comprising:
a. generating Reference Data, by using either Computer Aided Design (CAD) data or by combining scans of one or multiple known good parts, the Reference Data used for generating parameters for measuring parts,
b. creating one or more tolerance bands in the Reference Data, around each of one or more features to be measured, such that when parts of acceptable tolerance are scanned, each scanned feature falls within a tolerance band defined by the corresponding tolerance bands in the Reference Data, c. locating edge pixels, in the Reference Data, along a perimeter of each feature, d. for each edge pixel thus located, creating a measurement vector that originates from the edge pixel and points toward an opposite side of the feature, the vector oriented perpendicular to or at a predetermined angle with respect to the perimeter thereby also indicating edge orientation and whose vector length is the distance to the edge pixel on the opposite side of the feature, e. storing information representative of a vector length, vector orientation, starting edge pixel, and ending edge pixel coordinates for each measurement vector, the stored information defining measurement locations to be used to locate feature edges when the part is subsequently measured, f. defining a linear search range to be used to locate each starting and ending edge pixel for each measurement vector, when the part is subsequently measured,
 i. with each linear search range having a search axis oriented in a same angular orientation as its corresponding measurement vector,
 ii. limits of search in one direction along the search axis extending away from each edge pixel with a limit in that one direction extending to or beyond a boundary defined by a closest tolerance band to that edge pixel, and
 iii. a limit in the other direction along the search axis, for that same edge pixel, being equal to or greater than a closest distance between the edge pixel lying along the measurement axis on the other side of the feature and its closest tolerance band, g. storing corresponding search ranges for each expected starting edge pixel and ending edge pixel location, h. moving each feature in the Reference Data to all positions within its tolerance band, and for each position of the feature at each previously stored starting and ending pixel measurement location, searching for edge pixels of the feature within the specified search range, and
 i. when an edge pixel is found on the feature,
  A. computing a length of a measurement vector, as a length from that edge pixel found to the edge pixel on the opposite side of the feature, said length determined at the previously stored measurement angle, and
  B. storing as an allowable outcome the length of a measurement vector associated with each measurement location, and
  C. when a length of a measurement vector exceeds a maximum measurable value, storing a representation of this result as an allowable outcome
 ii. when an edge pixel is not found on the feature, storing a representation of this result as an allowable outcome i. storing for each spatially fixed measurement location, a minimum and maximum allowable vector dimension, and allowable representations thereof, corresponding to the plurality of positions of the feature within its tolerance band, j. storing and indicating, in a Measurement Parameter List, edge pixel measurement locations for those vectors whose length does not change or only changes within a small defined minimal critical width tolerance as each feature is moved within its corresponding tolerance band, such vectors referred to as Critical Width Vectors, k. when measuring features on a part, from a scanned image, for each Critical Width Vector, searching for the edge pixels of a feature within the search ranges around the specified starting and ending edge pixel measurement locations and computing a vector length measurement defined as the length between those two found edges, l. computing, from those vector length measurements, statistical data as a function of feature type, with said statistical data computed over the entire part, or for sections of a part, or for different die on a part or sections within different die on the part, with a given feature type being represented by features of the same dimensions in the Reference Data, m. the statistical data being computed for a feature type being at least one of a minimum, a maximum, an average, a standard deviation, or other statistical value, and n. reporting said statistical data, to characterize the part or for process control.

8. The method of claim 7 further comprising:
computing edge pixel locations to sub-pixel accuracy using an edge finding filter, such as, but not limited to a Sobel or Prewitt type filter.

9. The method of claim 7 additionally comprising:
comparing the scanned image of the part to a reference image to find defects.

10. The method of claim 7 additionally comprising:
a. converting the CAD data to a grayscale image, and
b. convolving or processing the grayscale image through a two-dimensional filter to simulate blurring of imaging optics to better match the Reference Data to the scanned image.

11. The method of claim 7 in which the part contains conductors and insulators that can be distinguished from each other in a scanned camera image.

12. The method of claim 7 additionally comprising:
a. during inspecting of a part from a scanned image, for a plurality of measurement locations corresponding to the locations of features in the Reference Data, where a feature dependent measurement is to be computed,
 i. searching for edge pixels of said feature in the scanned image, within the search ranges around the expected edge pixel locations specified in the Reference Data,
 ii. presenting to a Feature Shape Processor for analysis, locations of edge pixels found associated with each feature, and
 iii. the Feature Shape Processor then measuring one or more feature dimensions, and measuring at least one of a distance of found edge pixels to a predetermined expected shape, or a widest dimension, a narrowest dimension, or a center of the feature,
b. computing, from those feature dimensions, statistical data for features of the same shape and size in the Reference Data, with said statistical data computed over the entire part, or for sections of a part, or for different die on a part or sections within different die on the part, and
c. reporting said statistical data, to characterize the part or for process control.

13. The method of claim 1 additionally comprising:
a. storing and indicating, in said Inspection Parameter List, additional vectors whose length does not change or only changes within a small defined minimal critical width tolerance as each feature is moved within its corresponding tolerance band in the Reference Data, such vectors referred to as Critical Width Vectors, b. when measuring features on a part, from a scanned image, for each Critical Width Vector, searching for the edge pixels of a feature within the search ranges around the specified starting and ending edge pixel measurement locations and computing a vector length measurement defined as the length between those two found edges, c. computing, from those Critical Width vector length measurements, statistical data as a function of feature type, with said statistical data computed over the entire part, or for sections of a part, or for different die on a part or sections within different die on the part, with a given feature type being represented by features of the same dimensions in the Reference Data, d. the statistical data being computed for a feature type being at least one of a minimum, a maximum, an average, and a standard deviation, statistical value, and e. reporting said statistical data, to characterize the part or for process control.

14. A method for inspecting features in a part for defects, the method comprising:

a. locating Reference Data, b. defining a tolerance band that specifies how much one or more features may spatially deviate from the Reference Data, c. creating measurement vectors at fixed spatial locations around a perimeter of each feature, d. each measurement vector representing a dimension of the feature in the Reference Data from a point on the perimeter to another point on the perimeter at a specified angle, e. defining a linear search range around each fixed spatial location to enable finding of starting and ending points for each measurement vector, f. each linear search range having a search axis oriented in a same angular orientation as its corresponding measurement vector, g. for each feature to be inspected, moving the feature to a plurality of positions within the feature's tolerance band, and h. for each position of the feature and at each previously created spatially fixed measurement location, searching for points along the perimeter of the feature within the defined linear search range, and i. when a point is found,
  A. measuring a vector dimension at the angle specified by the corresponding measurement vector, and
  B. storing as allowable, the vector dimension, or a representation indicating when the measurement dimension exceeds a maximum measurable value, ii. when no point is found, storing a representation of this result as allowable, and i. storing for each spatially fixed measurement location, minimum and maximum allowable vector dimensions, and allowable representations thereof, corresponding to the plurality of positions of the feature within its tolerance band, j. modifying each minimum and maximum allowable vector dimension, or representation thereof, by adding a variance to allow for acceptable process variations during inspection of the part, k. when inspecting a part from a scanned image, for each measurement vector, within the defined linear search ranges for that vector, searching for a point along the perimeter of a feature, and
  i. when a point is not located, producing a representation indicating no point on the perimeter is found,
  ii. when a point is located, measuring a vector dimension at the angle specified for that vector and producing a representation indicating when the dimension exceeds a maximum measurable value l. reporting as a defect, vector dimensions that are less than the minimum allowable vector dimension or representation thereof or greater than the maximum allowable vector dimension or representation thereof.

15. The method of claim 14 in which the location of points along the perimeter of a feature are computed to sub-camera pixel accuracy using an edge finding filter, such as, but not limited to a Sobel or Prewitt type filter.

16. The method of claim 14 additionally comprising:
comparing the scanned image of the part to a reference image to find defects.

17. The method of claim 14 additionally comprising:
a. converting Computer Aided Design (CAD) data to a grayscale image, and
b. convolving or processing the grayscale image through a two-dimensional filter to simulate blurring of imaging optics to thereby better match the Reference Data to the scanned image.

18. The method of claim 14 in which the part contains conductors and insulators that can be distinguished from each other in a scanned camera image.

19. The method of claim 14 additionally comprising:
a. during inspecting of a part from a scanned image, for a plurality of measurement locations corresponding to the locations of features in the Reference Data, where a feature dependent measurement is to be computed,
  i. searching for edge pixels of said feature in the scanned image, within the search ranges around the expected edge pixel locations specified in the Reference Data,
  ii. presenting to a Feature Shape Processor for analysis, locations of edge pixels found associated with each feature, and
  iii. the Feature Shape Processor then measuring one or more feature dimensions, and measuring at least one of, a distance of found edge pixels to a predetermined expected shape, or a widest dimension, a narrowest dimension, or a center of the feature, and
b. reporting as a defect measured feature dimensions that exceed predetermined values.

20. A method for measuring features in a part, the method comprising:
a. locating Reference Data,
b. defining a tolerance band that specifies how much one or more features may spatially deviate from the Reference Data,
c. creating measurement vectors at fixed spatial locations around a perimeter of each feature,
d. each measurement vector representing a dimension of the feature in the Reference Data from a point on the perimeter to another point on the perimeter at a specified angle,
e. defining a linear search range around each fixed spatial location to enable finding of starting and ending points for each measurement vector, f. each linear search range having a search axis oriented in a same angular orientation as its corresponding measurement vector, g. for each feature to be measured, moving the feature to a plurality of positions within the feature's tolerance band, and h. for each position of the feature and at each previously created spatially fixed measurement location, searching for points along the perimeter of the feature within the defined linear search range, and
   i. when a point is found,
      A. measuring a vector dimension at the angle specified by the corresponding measurement vector, and
      B. storing as allowable, the vector dimension, or representation indicating when the measurement dimension exceeds a maximum measurable value,
   ii. when no point is found, storing a representation of this result as being allowable, i. storing for each spatially fixed measurement location, minimum and maximum allowable vector dimensions, and allowable representations thereof, corresponding to the plurality of positions of the feature within its tolerance band, j. further storing and marking as Critical Dimension Vectors those measurement vectors whose dimension does not change, or only changes within a defined minimal critical dimensional tolerance, as each feature is moved within its corresponding tolerance band, k. when measuring a part from a scanned image, for each Critical Dimension Vector,
   i. within the defined linear search ranges for that vector, locating points along the perimeter of the feature, and
   ii. for each such perimeter point located, measuring a vector dimension at the same angle as its corresponding measurement vector calculated from the Reference Data, l. computing, from the Critical Dimension Vector measurements, statistical data as a function of feature type, with said statistical data computed over the entire part, or for sections of a part, or for different die on a part or sections within different die on the part, with a given feature type being represented by features of the same dimensions in the Reference Data, m. the statistical data being computed for a feature type being at least one of a minimum, a maximum, an average, a standard deviation, or other statistical value, and n. reporting said statistical data, to be used to characterize the part or for process control.

21. The method of claim 20 in which the location of points along the perimeter of a feature are computed to sub-camera pixel accuracy using an edge finding filter, such as, but not limited to a Sobel or Prewitt type filter.

22. The method of claim 20 additionally comprising: comparing the scanned image of the part to a reference image to find defects.

23. The method of claim 20 additionally comprising:
a. converting Computer Aided Design (CAD) data to a grayscale image, and b. convolving or processing the grayscale image through a two-dimensional filter to simulate blurring of imaging optics to thereby better match the Reference Data to the scanned image.

24. The method of claim 20 in which the part contains conductors and insulators that can be distinguished from each other in a scanned camera image.

25. The method of claim 20 additionally comprising:
a. during inspecting of a part from a scanned image, for a plurality of measurement locations corresponding to the locations of features in the Reference Data, where a feature dependent measurement is to be computed,
   i. searching for edge pixels of said feature in the scanned image, within the search ranges around the expected edge pixel locations specified in the Reference Data,
   ii. presenting to a Feature Shape Processor for analysis, locations of edge pixels found associated with each feature,
   iii. the Feature Shape Processor then measuring one or more feature dimensions, including measuring at least one of a distance of found edge pixels to a predetermined expected shape, or a widest dimension, a narrowest dimension, or a center of the feature,
b. computing, from those feature dimensions, statistical data for features of the same shape and size in the Reference Data, with said statistical data computed over the entire part, or for sections of a part, or for different die on a part or sections within different die on the part, the statistical data being computed for at least one of, a minimum, a maximum, an average, and a standard deviation for the measured feature dimensions, and
c. reporting the statistical data, to be used to characterize the part or for process control.

26. The method of claim 14 additionally comprising:
a. further storing and indicating those measurement vectors, called Critical Width Vectors, whose dimension does not change, or only changes within a small defined minimal critical dimensional tolerance, as each feature is moved within its corresponding tolerance band in the Reference Data, and
b. when measuring a part from a scanned image, for each Critical Dimension Vector,
   i. within the search ranges for that vector, locating points along the perimeter of the feature, and
   ii. at each such perimeter point located, measuring a vector dimension at the same angle as its corresponding measurement vector in the Reference Data,
c. computing from the vector dimension measurements, statistical data as a function of feature type, with said statistical data computed over the entire part, or for sections of a part, or for different die on a part or sections within different die on the part, with a given feature type being represented by features of the same dimensions in the Reference Data,
d. statistical data being computed for, but not limited to, minimum, maximum, average, and standard deviation feature sizes for different feature types, and
e. reporting said statistical data, to be used to characterize the part or for process control.

* * * * *